(12) United States Patent
Chen et al.

(10) Patent No.: US 6,335,130 B1
(45) Date of Patent: Jan. 1, 2002

(54) SYSTEM AND METHOD OF PROVIDING OPTICAL PROXIMITY CORRECTION FOR FEATURES USING PHASE-SHIFTED HALFTONE TRANSPARENT/SEMI-TRANSPARENT FEATURES

(75) Inventors: J. Fung Chen, Cupertino, CA (US); John S. Petersen, Austin, TX (US)

(73) Assignee: ASML Masktools Netherlands B.V., Veldhoven (NL)

( * ) Notice: Subject to any disclaimer, the term of this patent is extended or adjusted under 35 U.S.C. 154(b) by 0 days.

(21) Appl. No.: 09/562,445

(22) Filed: May 1, 2000

(51) Int. Cl.[7] .............................. G03F 9/00; G06F 17/50
(52) U.S. Cl. ............................... 430/5; 716/19; 716/21
(58) Field of Search ..................... 430/5, 322; 716/19, 716/20, 21; 250/492.22, 492.2

(56) References Cited

U.S. PATENT DOCUMENTS

| | | | |
|---|---|---|---|
| 5,229,255 A | 7/1993 | White | 430/311 |
| 5,242,770 A | 9/1993 | Chen et al. | 430/5 |
| 5,256,505 A | 10/1993 | Chen et al. | 430/5 |
| 5,288,569 A | 2/1994 | Lin | 430/5 |
| 5,324,600 A | 6/1994 | Jinbo et al. | 430/5 |
| 5,362,584 A | 11/1994 | Brock et al. | 430/5 |
| 5,424,154 A | 6/1995 | Borodovsky | 430/5 |
| 5,436,095 A | 7/1995 | Mizuno et al. | 430/5 |
| 5,447,810 A | 9/1995 | Chen et al. | 430/5 |
| 5,538,815 A | 7/1996 | Oi et al. | 430/5 |
| 5,663,893 A | 9/1997 | Wampler et al. | 364/491 |
| 5,698,347 A | * 12/1997 | Bae | 430/5 |
| 5,707,765 A | 1/1998 | Chen | 430/5 |
| 5,723,233 A | 3/1998 | Garza et al. | 430/5 |
| 5,821,014 A | 10/1998 | Chen et al. | 430/5 |
| 5,827,623 A | 10/1998 | Ishida et al. | 430/5 |
| 6,114,071 A | 9/2000 | Chen et al. | 430/5 |
| 6,114,095 A | * 9/2000 | Nakabayashi et al. | 430/5 |

* cited by examiner

Primary Examiner—S. Rosasco
(74) Attorney, Agent, or Firm—McDermott, Will & Emery

(57) ABSTRACT

Method for utilizing halftoning structures to manipulate the relative magnitudes of diffraction orders to ultimately construct the desired projected-image. At the resolution limit of the mask maker, this is especially useful for converting strong shifted, no $0^{th}$ diffraction order, equal line and space chromeless phase edges to weak phase shifters that have some $0^{th}$ order. Halftoning creates an imbalance in the electric field between the shifted regions and therefore results in the introduction of the $0^{th}$ diffraction order.

10 Claims, 33 Drawing Sheets

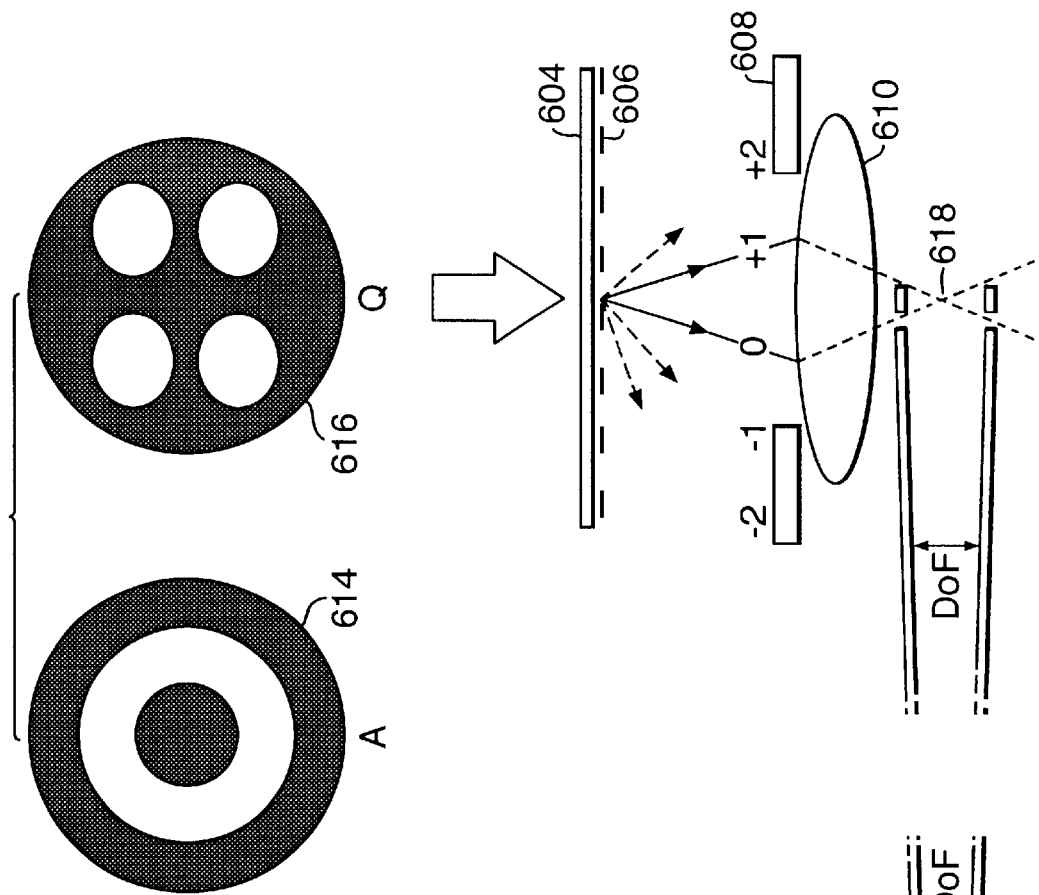
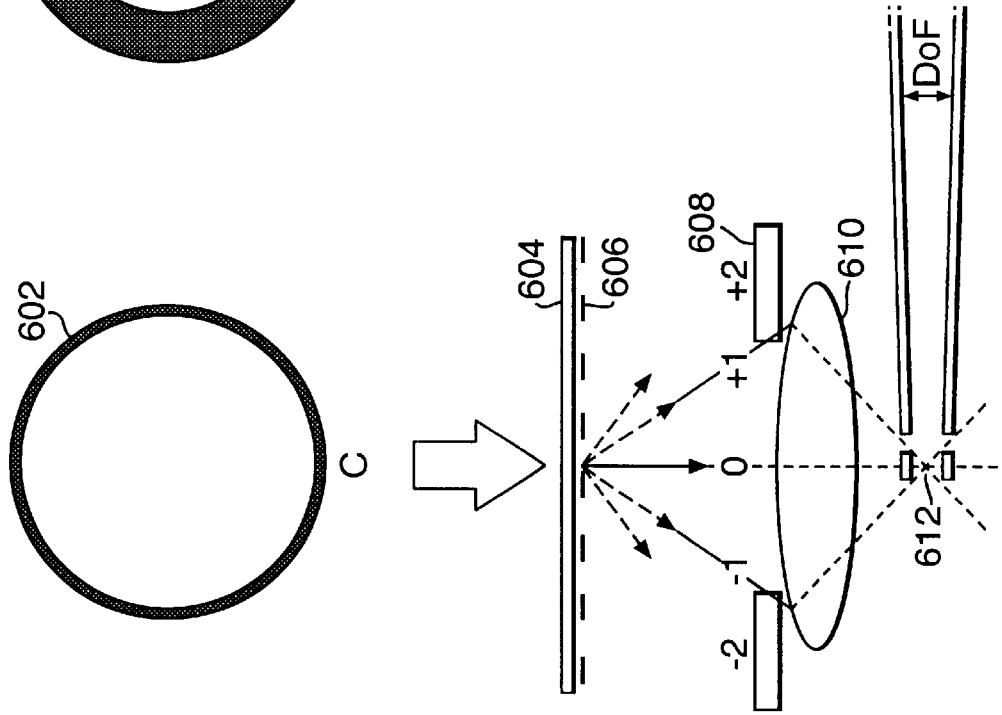
Fig.6(A).
Fig.6(B).

Fig.7(A).
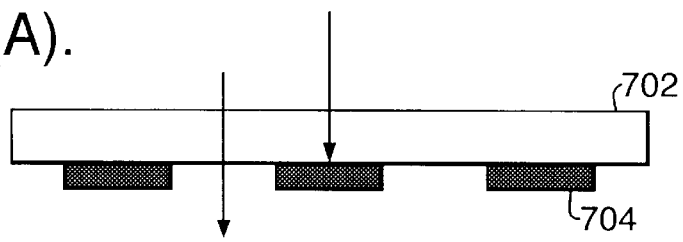
Fig.7(B). $\Delta\varnothing = 2\pi\ t(n-1)/\lambda$
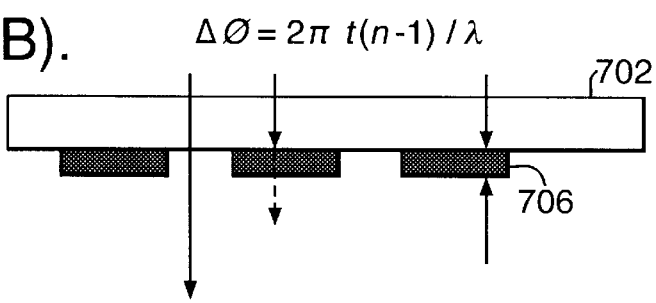
Fig.7(C).
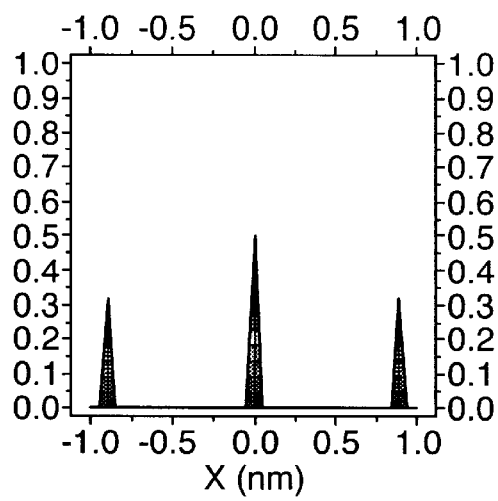
Fig.7(D).
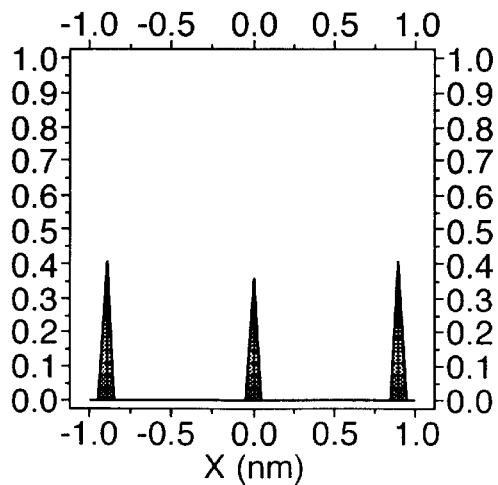

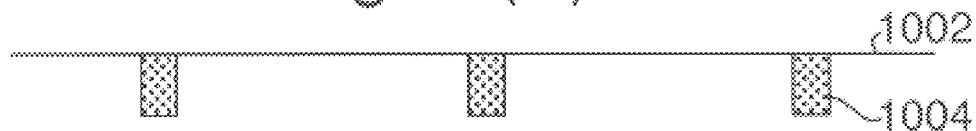
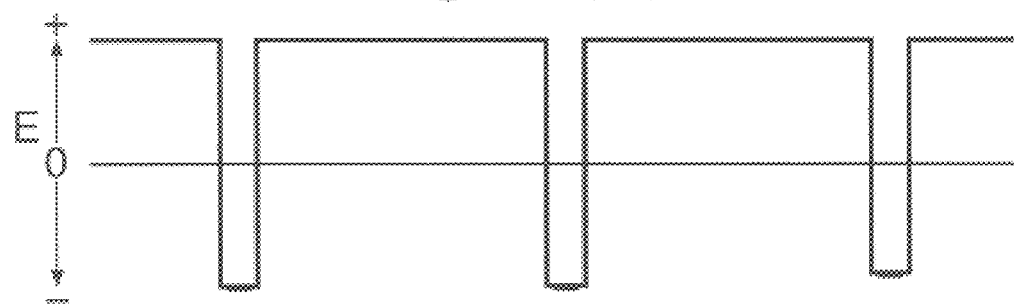
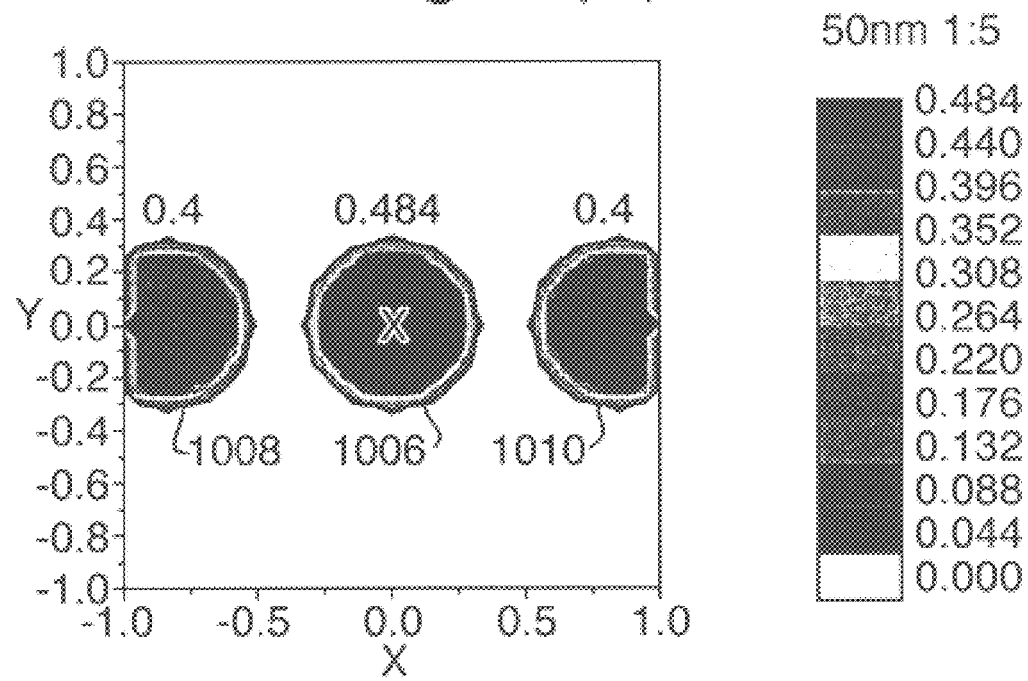

CPE

HCPE

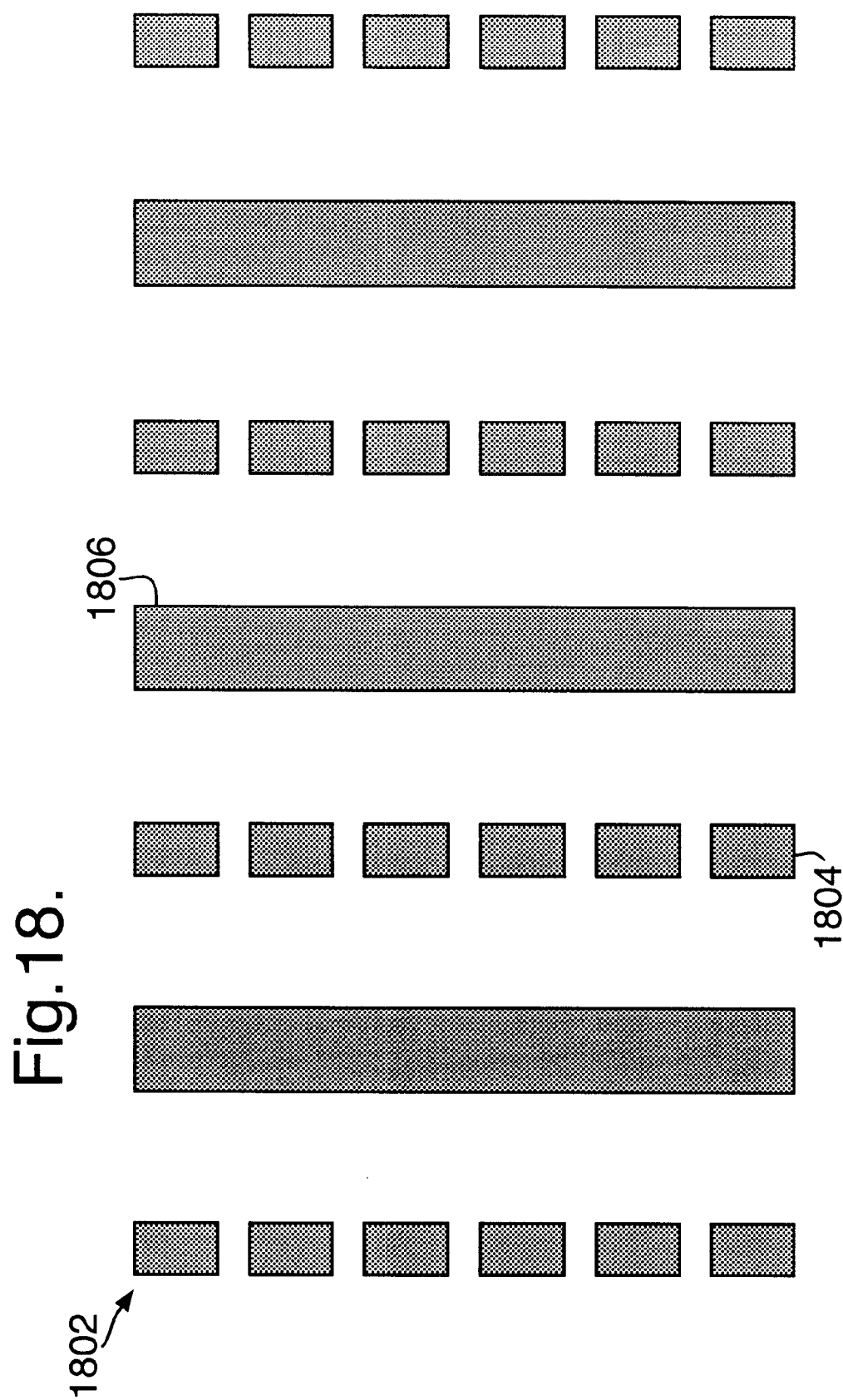

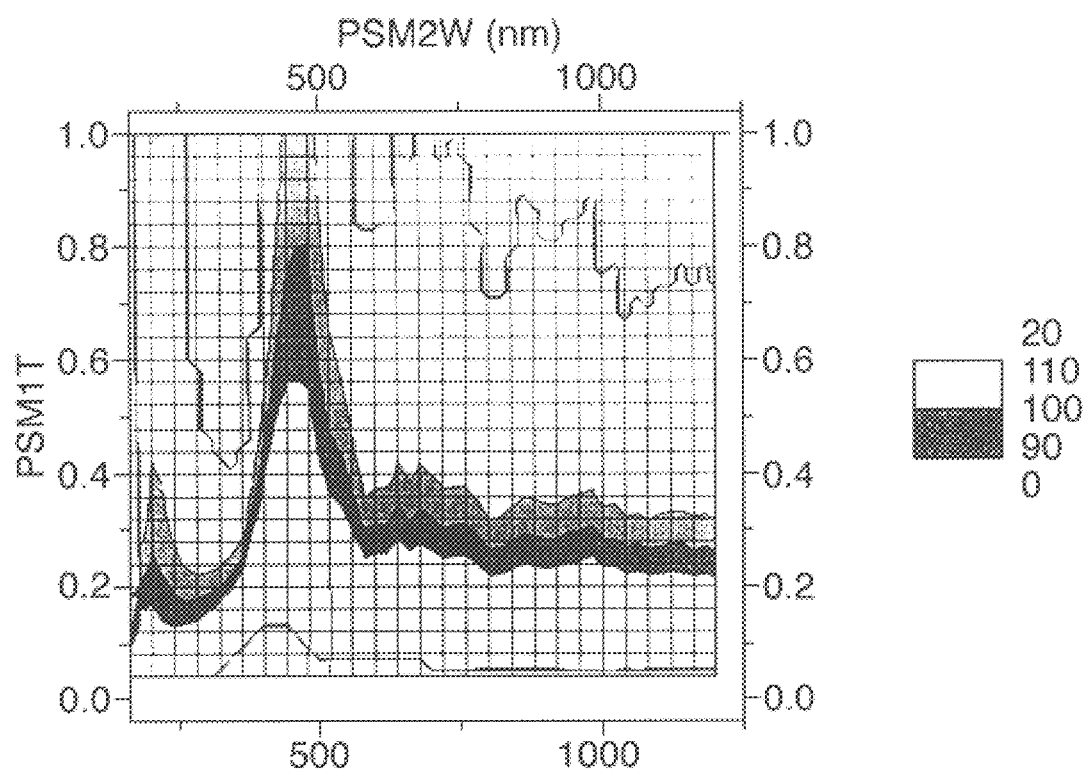

26%T att PSM 400p 26%T

100%T HT PSM 400p 115nm 180nm htp 67%

DoF=0.4 μm

DoF=1.7 μm

SYSTEM AND METHOD OF PROVIDING OPTICAL PROXIMITY CORRECTION FOR FEATURES USING PHASE-SHIFTED HALFTONE TRANSPARENT/SEMI-TRANSPARENT FEATURES

FIELD OF INVENTION

The present invention generally relates optical lithography and more particularly to the design layout and fabrication of transparent or semitransparent phase-shifting masks or reticles that can be used in the manufacture of semiconductor devices.

BACKGROUND OF THE INVENTION

In lithography, an exposure energy, such as ultraviolet light, is passed through a mask (or reticle) and onto a target such as a silicon wafer. The reticle typically may contain opaque and transparent regions formed in a predetermined pattern. The exposure energy exposes the reticle pattern on a layer of resist formed on the target. The resist is then developed for removing either the exposed portions of resist for a positive resist or the unexposed portions of resist for a negative resist. This forms a resist mask. A mask typically may comprise a transparent plate such as fused silica having opaque (chrome) elements on the plate used to define a pattern. A radiation source illuminates the mask according to well-known methods. The radiation transmitted through the mask and exposure tool projection optics forms a diffraction limited latent image of the mask features on the photoresist. The resist mask can then be used in subsequent fabrication processes. In semiconductor manufacturing, such a resist mask can be used in deposition, etching, or ion implantation processes, to form integrated circuits having very small features.

As semiconductor manufacturing advances to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

As the nominal minimum feature sizes continue to decrease, control of the variability of these feature sizes becomes more critical. For example, the sensitivity of given critical dimensions of patterned features to exposure tool and mask manufacturing imperfections as well as resist and thin films process variability is becoming more significant. In order to continue to develop manufacturable processes in light of the limited ability to reduce the variability of exposure tool and mask manufacturing parameters, it is desirable to reduce the sensitivity of critical dimensions of patterned features to these parameters.

As feature sizes decrease, semiconductor devices are typically less expensive to manufacture and have higher performance. In order to produce smaller feature sizes, an exposure tool having adequate resolution and depth of focus at least as deep as the thickness of the photoresist layer is desired. For exposure tools that use conventional or oblique illumination, better resolution can be achieved by lowering the wavelength of the exposing radiation or by increasing the numerical aperture of the exposure tool, but the smaller resolution gained by increasing the numerical aperture is typically at the expense of a decrease in the depth of focus for minimally resolved features. This constraint presents a difficult problem in reducing the patterning resolution for a given radiation wavelength.

A reduction projection exposure method that features mass-producibility and excellent resolution has been used widely for forming patterned features. According to this method, the resolution varies in proportion to the exposure wavelength and varies in inverse proportion to the numerical aperture (NA) of the projection optical system. The NA is a measure of a lens' capability to collect diffracted light from a mask and project it onto the wafer. The resolution limit R (nm) in a photolithography technique using a reduction exposure method is described by the following equation:

$$R = K_1 \lambda / (NA)$$

Where:

$\lambda$ is the wavelength (nm) of the exposure light;

NA is the numerical aperture of the lens; and $K_1$ is a constant dependent on a type of resist.

So far, increases in the resolution limit have been achieved by increasing the numerical aperture (high NA). This method, however, is approaching its limit due to, a decrease in the depth of focus, difficulty in the design of lenses, and complexity in the lens fabrication technology itself. In recent years, therefore, attention has been given to an approach for shortening the wavelength of the exposure light in order to form finer patterns to support an increase in the integration density of LSIs. For example, a 1-Gbit DRAM requires a 0.2-micrometer pattern while a 4-Gbit DRAM requires a 0.1-micrometer pattern. In order to realize these patterns, exposure light having shorter wavelengths must be used.

However, because of increased semiconductor device complexity that results in increased pattern complexity, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore, making diffraction a severe limiting factor for optical photolithography.

A conventional method of dealing with diffraction effects in optical photolithography is achieved by using a phase shift mask, which replaces the previously discussed mask. Generally, with light being thought of as a wave, phase shifting is a change in timing of a shift in waveform of a regular sinusoidal pattern of light waves that propagate through a transparent material.

Typically, phase-shifting is achieved by passing light through areas of a transparent material of either differing thickness or through materials with different refractive indexes, or both, thereby changing the phase or the periodic pattern of the light wave. Phase shift masks reduce diffraction effects by combining both diffracted light and phase shifted diffracted light so that constructive and destructive interference takes place favorably. On the average, a minimum width of a pattern resolved by using a phase shifting mask is about half the width of a pattern resolved by using an ordinary mask.

There are several different types of phase shift structures. These types include: alternating aperture phase shift structures, subresolution phase shift structures, rim phase shift structures, and chromeless phase shift structures. "Alternating Phase Shifting" is a spatial frequency reduction concept characterized by a pattern of features alternately covered by a phase shifting layer. "Subresolution Phase Shifting" promotes edge intensity cut off by placing a subresolution feature adjacent to a primary image and covering it with a phase shifting layer. "Rim Phase Shifting" overhangs a phase shifter over a chrome mask pattern.

In general, these phase shift structures are constructed on reticles (or masks) having three distinct layers of material. An opaque layer is patterned to form light blocking areas that allow none of the exposure light to pass through. A transparent layer, typically the substrate, is patterned with light transmissive areas, which allow close to 100% of the exposure light to pass through. A phase shift layer is patterned with phase shift areas which allow close to 100% of the exposure light to pass through but phase shifted by 180° ($\pi$). The transmissive and phase shifting areas are situated such that exposure light diffracted through each area is canceled out in a darkened area therebetween. This creates the pattern of dark and bright areas, which can be used to clearly delineate features. These features are typically defined by the opaque layer (i.e., opaque features) or by openings in the opaque layer (i.e., clear features).

For semiconductor manufacture, alternating aperture phase shift reticles may typically be used where there are a number of pairs of closely packed opaque features. However, in situations where a feature is too far away from an adjacent feature to provide phase shifting, subresolution phase shift structures typically may be employed. Subresolution phase shift structures typically may be used for isolated features such as contact holes and line openings, wherein the phase shift structures may include assist-slots or outrigger structures on the sides of a feature. Subresolution phase shift structures are below the resolution limit of the lithographic system and therefore do not print on the target. One shortcoming of subresolution phase shift structures is that they require a relatively large amount of real estate on the reticle.

Rim phase shifting reticles include phase shift structures that are formed at the rim of features defined by opaque areas of the reticle. One problem with rim phase shifter structures is that they are difficult to manufacture. In the case of rim phase shift structures, multiple lithographic steps must be used to uncover the opaque layer so that it can be etched away in the area of the rim phase shifter. This step is difficult as the resist used in the lithographic step covers not only the opaque layer but also trenches etched into the substrate.

In general, improvement of the integration density of semiconductor integrated circuits in recent years has been achieved mainly through a reduction in size of the various circuit patterns. These circuit patterns are presently formed mainly by optical lithography processes using a wafer stepper.

FIG. 1 shows the structure of such a prior art stepper. Mask 102 is illuminated by the light emitted from illumination system 102. An image of mask 108 is projected onto a photoresist film coated on wafer 120 which is the substrate to be exposed through projection system 110. As shown in FIG. 1, illumination system 102 includes a source 100, condenser lens 104, and aperture 106 for specifying the shape and size of the effective source. Projection system 110 includes a projection lens 112, pupil filter 114, and aperture 116 arranged in or near the pupil plane of focussing lens 118 to set the numerical aperture (NA) of the lens.

As discussed earlier, the minimum feature size R of patterns transferable by an optical system is approximately proportional to the wavelength $\lambda$ of the light used for exposure and inversely proportional to the numerical aperture (NA) of the projection optical system. Therefore, size R is expressed as R=$k_1\lambda$/NA, where $k_1$ is an empirical constant and $k_1$=0.61 is referred to as the Rayleigh limit.

In general, when the pattern dimensions approach the Rayleigh limit, the projected image is no longer a faithful reproduction of the mask pattern shape. This phenomenon is known as optical proximity effects and results in corner rounding, line-end shortening, and line width errors, among other things. To solve this problem, algorithms have been proposed that can be used to pre-distort the mask pattern so that the shape of a projected image takes on the desired shape.

Moreover, approaches have been described which improve the resolution limit of a given optical system, resulting effectively in a decreased value of $k_1$. Adoption of a phase shifting mask, such as described above, is a typical example of this approach. A phase shifting mask is used to provide a phase difference between adjacent apertures of a conventional mask.

A chromeless phase shifting mask method is known as a phase shifting method suitable for the transfer of a fine isolated opaque line pattern, which is needed, for example, for the gate pattern of a logic LSI.

Off-axis illumination and pupil filtering are methods additionally known for improving images. According to the off-axis illumination method, the transmittance of aperture 106 is modified in the illumination system 102 of FIG. 1. One particular embodiment of this method changes the illumination intensity profile so that the transmittance at the margin becomes larger than that of the central portion, which is particularly effective to improve the resolution of a periodic pattern and the depth of focus. The pupil filtering method is a method of performing exposure through a filter (pupil filter) located at the pupil position of a projection lens to locally change the amplitude and phase of the transmitted light. For example, this approach makes it possible to greatly increase the depth of focus of an isolated pattern. Furthermore, it is well known that the resolution of a periodic pattern can further be improved by combining the off-axis illumination method and the pupil filtering method.

Nonetheless, an inherent problem with a conventional transmission mask, such as the ones described above, is that the substrate undergoes a decrease in transmissivity as the wavelength of light emitted from an exposure light source is decreased to obtain finer patterns. For example, a quartz material substrate becomes more opaque as the wavelength of the light source decreases, particularly when the wavelength is less than 200 nm. This decrease in transmissivity affects the ability to obtain finer resolution patterns. For this reason, a material for a transmission phase shifting mask which can obtain a high transmissivity with respect to light having a short wavelength is needed. It is, however, difficult to find or manufacture such a material having a high transmissivity with respect to short wavelength exposure light.

An example of photomask pattern is shown in FIG. 2. Passage of radiation around these features causes diffraction of the radiation into discrete dark and bright areas. The bright areas are known as the diffraction orders and the collective pattern they form is mathematically describable by taking the Fourier transform of the collective opaque and transparent region. The pattern that is observed in its simplest personification has an intense diffraction order, called the $0^{th}$ order, surrounded in a symmetrical fashion by less intense diffraction orders. These less intense orders are called the plus, minus first ($\pm 1^{st}$) order; plus, minus second ($\pm 2^{nd}$) order on into an infinity of orders. For the same feature width, different diffraction patterns are formed for dense and isolated features. FIG. 3(A) shows the magnitudes of relative electric fields and respective pupil positions of diffraction orders for a dense feature, while FIG. 3(B) shows the magnitudes of diffraction orders for an isolated one. The center peak observed at each plot is the $0^{th}$ order.

The $0^{th}$ order contains no information about the pattern from which it arose. The information about the pattern is contained in the non-zero orders. However, the $0^{th}$ order is spatially coherent with the higher orders so that when the beams are redirected to a point of focus they interfere, and in doing so construct an image of the original pattern of opaque and transparent objects. If all the diffraction orders are collected a perfect representation of the starting object is imaged. However, in high-resolution lithography of small pitch features, where pitch is the sum of the width of the opaque and transparent objects, only the $0^{th}$ and the $\pm 1^{st}$ orders are collected by the projection lens to form the image. This is because higher orders are diffracted at higher angles that fall outside of the lens pupil as defined by numerical aperture (NA).

As depicted in FIG. 4(A), the $0^{th}$ order 402 and the $\pm 1^{st}$ orders 404 lie within the lens pupil 406. As further depicted in FIG. 4(A), the $\pm 2^{nd}$ orders 408, lie outside the lens pupil 406. Further, as seen in FIG. 4(B), a corresponding aerial image is formed during exposure. The photo resist pattern is then delineated from this aerial image.

It has long been known that it is only necessary to collect two diffraction orders, such as either with the $0^{th}$ order and at least one of higher diffraction orders, or simply with two higher orders without the $0^{th}$ order, to form the image.

As depicted in FIG. 5(A), light transmitted through a focussing lens 502 is represented by that which is normal 504 to the object (not shown), and that which transmits through the edges 506, 508 of the focussing lens 502. Although light is continuously transmitted throughout the entire surface of lens 502, the three light paths 504–508 are represented to illustrate phase matching of different light paths. At point 510, the three light paths 504–508 focus and are in phase together. When three light paths 504, 512, and 514 focus together at point 516, however, they are not in phase. The phase error from a change in path-lengths of 512 and 514 from respective path-lengths 506 and 508 results in a finite depth of focus, DoF, of the system.

One may improve the tolerance to variations in relative phase error caused by aberrations like defocus as depicted in FIG. 5(A). FIG. 5(B) represents how by eliminating the light path that is normal to the object, variations to the phase error may be reduced. Again, although light is continuously transmitted throughout the surface of lens 502, the two light paths 506 and 508 are represented to illustrate phase matching of different light paths. At point 510, the two light paths 506 and 508 focus and are in phase together. When the two light paths 512 and 514 focus together at point 516, they are in phase. Without the light path 504 as seen in FIG. 5(A), the phase error from the increased path-lengths of 512 and 514 over respective path-lengths 506 and 508 is eliminated and results in an infinite depth of focus, DoF, of the system. Eliminating the light path normal to the object may be accomplished by placing an obscuration in the center of the radiation source thus eliminating light normal to the object and allowing only oblique illumination, as depicted for example in FIGS. 6(A) and 6(B).

FIG. 6(A) depicts a lithographic "on-axis" projection system wherein the reticle 602 permits transmission of the light path normal to the object. In the figure, light passes through the reticle 602, comprising a glass substrate 604 and chrome patterns 606, through the lens aperture 608, into lens 610, and is focused into area 612. FIG. 6(B) depicts exemplary lithographic "off-axis" projection systems wherein the an annular reticle 614, or quadrupole reticle 616, prohibits transmission of the light path normal to the object. In the figure, light passes through the glass substrate 604, past the chrome patterns 606, through the lens aperture 608, into lens 610, and is focused into area 618. Comparing FIGS. 6(A) and 6(B), it is noted that the DoF of FIG. 6(A) is smaller than that of FIG. 6(B).

Lowering the $0^{th}$ order's magnitude to be the same or less than that of the $1^{st}$ order improves the imaging tolerance of this two beam imaging system. One method for tuning the magnitude of the diffraction orders is to use weak phase shift masks. Strong phase shift masks and weak phase shift masks differ in operation and effect.

Strong phase shift masks eliminate the zero-diffraction order and double the resolution through a technique of frequency doubling. To understand how strong shifters work, it is useful to think of the critical pitch as having alternating clear areas adjacent to the main opaque feature. Because of the alternating phase regions, the pitch between same phase regions is doubled. This doubling, halves the position the diffraction orders would otherwise pass through the projection lens relative to the critical pitch; thus making it possible to image features with half the pitch allowed by conventional imaging. When the two opposing phase regions add through destructive interference, to build the final image, the magnitude of their respective zero order light is equal in magnitude but of opposite phase, thus canceling each other. Imaging is done only with the frequency doubled higher orders. On the other hand, weak phase shift masks dampen the zero-order light and enhance the higher orders. Weak phase shift masks form their phase shift between adjacent features by creating electric fields of unequal magnitude and of opposite phase, with the field immediately adjacent to a critical feature having the lesser of the magnitudes. The net electric field reduces the magnitude of the zero order while maintaining the appropriate phase.

Weak phase shift masks permit an amount of exposure radiation to pass through objects in a fashion that creates a difference in phase between coherently linked points while having an imbalance in the electric field between the shifted regions. FIG. 7(A) depicts a substrate 702 and a mask 704 that does not permit phase shifting. FIG. 7(C) is a graph illustrating how the $0^{th}$ order's magnitude is larger than that of the $\pm 1^{st}$ orders' magnitude from a non-phase shifting mask as depicted in FIG. 7(A). FIG. 7(B) depicts a substrate 702 and a mask 706 that permits phase shifting. FIG. 7(D) is a graph illustrating how the $0^{th}$ order's magnitude is decreased to be comparable to that of the $\pm 1^{st}$ orders' magnitude from a phase shifting mask as depicted in FIG. 7(B).

Several types of phase-shifting masks are known in the art as the rim, attenuated or embedded (or incorrectly halftone), and unattenuated or chromeless (or transparent) shifter-shutter phase-shifting masks.

FIG. 8(A) is a cross-sectional view of a rim phase-shifting mask 802, comprising a light transmitting portion 804, and a light inhibiting portion 806. FIG. 8(B) is a graph representing the amplitude of the E-field at the mask, whereas FIG. 8(C) is a diagram representing the magnitude of the $0^{th}$ diffraction order 810, and $\pm 1^{st}$ orders 812, 814, coinciding with the respective pupil positions as depicted in FIG. 8(A).

FIG. 9(A) is a cross-sectional view of an attenuated or embedded phase-shifting mask 902 having an attenuation of 5%, comprising a light attenuating portion 904. FIG. 9(B) is a graph representing the amplitude of the E-field at the mask, whereas FIG. 9(C) is a diagram representing the magnitude of the $0^{th}$ diffraction order, and $\pm 1^{st}$ diffraction orders coinciding with the respective pupil positions as depicted in FIG. 9(A). FIG. 9(D) is a cross-sectional view of an attenuated or embedded phase-shifting mask 912 having an attenuation of 10%, comprising a light attenuating portion 914. FIG. 9(E) is a graph representing the amplitude of the E-field at the mask, whereas FIG. 9(F) is a diagram representing the magnitude of the $0^{th}$ diffraction order, and $\pm 1^{st}$ diffraction orders, coinciding with the respective pupil positions as depicted in FIG. 9(D).

FIG. 10(A) is a cross-sectional view of an unattenuated or chromeless (or transparent) shifter-shutter phase-shifting mask 1002, comprising a light-shifting portion 1004. FIG. 10(B) is a graph representing the amplitude of the E-field at the mask, whereas FIG. 10(C) is a diagram representing the magnitude of the $0^{th}$ diffraction order 1006, and $\pm 1^{st}$ diffraction orders 1080, 1010, coinciding with the respective pupil positions as depicted in FIG. 10(A).

Typically, the phase-shifting masks of FIG. 8 through FIG. 10 form their phase-shift differently but relative to their non-phase-shifted counterpart, they all yield a $0^{th}$ diffraction order of smaller amplitude and a first diffraction order of larger amplitude of its electric field. Which ratio of $1^{st}$ to $0^{th}$ diffraction order magnitude is optimal depends on the pitch of the feature being imaged along with the shape of the illuminator and the desired printing size in the developed photoresist. These tuned diffraction patterns are then used with off-axis illumination to image smaller pitches with better tolerance to imaging process variation.

The concept of manipulating of the amplitude ratio of $0^{th}$–$1^{st}$ diffraction orders has conventionally been restricted to using certain weak phase-shifting techniques with biasing features and sub-resolution assist features.

FIG. 11(A) depicts a conventional biasing technique used to resolve a desired feature. As seen in FIG. 11(A), biasing bars 1102 and 1104 are situated adjacent the mask of the primary feature 1106. FIG. 11(B) depicts a half-tone biasing technique known to the Applicants of the instant application and described in U.S. patent application Ser. No. 09/055,355 now U.S. Pat. No. 6,114,071, used to resolve a desired feature. As seen in FIG. 11(B), half-tone biasing bars 1108 and 1110 are situated adjacent the mask of the desired feature 1112. FIG. 12 depicts a conventional photoresist mask 1202. The photoresist mask 1202 comprises a plurality of scatter bars 1204, serifs 1206, and chrome shields 1208.

For conventional attenuated shifters, transparency of the shifter materials typically may be adjusted, and used along with biasing and sub-resolution assist features. Transparency of the shifters typically ranges from 3% to 10%, wherein higher transmissions such as from 10% to 100% are reported to be optimal for pitches where the space between the features is larger than the phase-shifted line. FIG. 13 shows the dependence of image contrast, as defined by the normalized-image-log-slope (NILS), with respect to varying transmittance of its phase-shifted material for a 175 nm line on a 525 nm pitch (FIG. 13A) and a 1050 nm pitch (FIG. 13B). Each curve in the figure represents a different focus setting. The curve with the largest NILS is the most focussed, and has a value of zero, and then with each change in focus the NILS of each respective curve decreases. FIG. 13A shows that the best transmission for the 175 nm line with the 525 nm pitch structure is 0.35 to 0.45. FIG. 13B shows that the best transmission for the 175 nm line with the 1050 nm pitch structure is 0.25 to 0.35.

An example of a 100% transparent attenuated phase-shifting technology is the previously mentioned, chromeless shifter-shutter, such as depicted in FIG. 10. Using a chromeless shifter-shutter, phase-edges of a pattern typically may be placed within an area that is 0.2 to 0.3 times the exposing wavelength $\lambda$ divided by the numerical aperture NA of the projection lens. For lines larger or smaller than this, the destructive interference is insufficient to prevent exposure in an area not be exposed. Printing features larger than this is accomplished in one of two ways. The first places an opaque layer in the region that is to stay dark with the feature edges being opaque or rim-shifted (FIG. 14). The second, as depicted in FIG. 15, creates a dark grating 1502 by placing a series of features 1504 whose size meets the criteria for printing an opaque line 1506 using chromeless technology.

Conventionally, chromeless phase shifting masks have not worked with off-axis exposure as the shifter (feature) sizes and shutter (space) sizes approach one another. FIGS. 16(A) through 16(C) depict a conventional chromeless phase shifting mask. In FIG. 16(A), 1602 is a cross-sectional view of a portion of a conventional chromeless phase shifting mask, comprising shifters 1604, and shutters 1606, wherein the shifter length is substantially equal to the shutter length. FIG. 16(B) is a graph representing the amplitude of the E-field at the mask 1602. FIG. 16(C) is a diagram representing the magnitudes of the $\pm 1^{st}$ diffraction orders 1608 and 1610 for the mask of FIG. 16(A). As seen in FIG. 16(C) there is no $0^{th}$ diffraction order. The functional limit of the relative sizes of the shifter and shutters of conventional chromeless phase shifting masks results from the integrated electric fields of the two opposing phase-shifted regions being equal. This balanced condition cancels the $0^{th}$ diffraction order making it impossible to get the prerequisite $0^{th}$ diffraction order needed for using off-axis illumination.

To summarize, each of the above-described, conventional, weak phase-shifting techniques solved certain imaging problems. However, each technique has accompanying drawbacks. For example, the rim, attenuated or embedded, and unattenuated or chromeless (or transparent) shifter-shutter phase-shifting masks provided large ratios in the $0^{th}$–$\pm 1^{st}$ diffraction orders. Prior art attempts to manipulate these ratios included using biasing techniques coupled with an attenuated phase shifting mask. However, these prior art attempts included complex manufacturing steps and yielded inefficient masks as a result of the attenuation. Furthermore, unattenuated shifter-shutter phase-shifting masks additionally failed to yield accurate images with off-axis illumination as the shifter and shutter sizes approached one another.

SUMMARY OF THE INVENTION

It is an object of this invention to provide a simple system and method for fabricating an efficient phase shifting mask that is able to manipulate the ratios in the $0^{th}$–$\pm 1^{st}$ diffraction orders.

It is another object of this invention to provide a system and method for fabricating a non-attenuated phase shifting mask that is able to manipulate the ratios in the $0^{th}$–$\pm 1^{st}$ diffraction orders.

It is yet another object of this invention to provide a system and method for fabricating a chromeless (or transparent) shifter-shutter phase-shifting mask that is usable with off-axis illumination when the shifter and shutter sizes approach one another.

It is still another object of this invention to provide a system and method for halftoning primary features to achieve the correct ratio of $0^{th}$ to higher diffraction order light for optimal imaging.

It is still yet another object of this invention to provide a system and method for halftoning assist features to achieve the correct ratio of $0^{th}$ to higher diffraction order light for optimal imaging.

The present invention provides an alternate method for effectivey manipulating the amplitude ratio of the $0^{th}$–$1^{st}$ diffraction order by using halftoning of opaque and phase-shifted transparent/semi-transparent features within the primary feature and as sub-resolution assist features. The relative magnitudes of the $0^{th}$ and higher diffraction orders are formed as the exposing wavelength passes through the plurality of zero and 180° phase-shifted regions. Subsequently some of the diffraction orders are collected and projected to form the image of the object.

Methods in accordance with the present invention further make use of halftoning structures to manipulate the relative magnitudes of diffraction orders to ultimately construct the desired projected-image. At the resolution limit of the mask maker, this is especially useful for converting strong shifted, no $0^{th}$ diffraction order, equal line and space chromeless phase edges to weak phase shifters that have some $0^{th}$ order. Halftoning creates an imbalance in the electric field between the shifted regions and therefore results in the introduction of the $0^{th}$ diffraction order. As such, with halftoning, these previously strong shifted features convert to weak phase-shifters and are compatible with the other shifter-shutter chromeless features typically found amongst the plurality of objects used in making a conventional semiconductor circuit.

Decreasing the size of the primary feature for the very dense features, as in the conventional mask fabrication technique, can achieve a limited extent of modifying diffraction order. Because of the interference effects, it is not possible to ensure that a mask width less than the sub-resolution assist feature can be reliably made using conventional mask fabrication methods. However, in accordance with the present invention, by biasing the primary features, the feature width can be reduced to less than the sub-resolution assist features.

Further, chromeless phase-shifting mask is known to be a powerful imaging method when combined with using off-axis illumination, but it has serious optical proximity effect. This invention provides an effective optical proximity solution.

In general, in one aspect, the invention features a method of transferring an image including $0^{th}$ diffraction order and $\pm 1^{st}$ diffraction orders, onto a material, wherein the method comprises the steps of fabricating a phase shifting mask comprising at least one unattentuated, halftoned, phase-shift feature, and off-axis illuminating the mask such that light passes through the mask onto the material.

In another aspect, the invention features a method of transferring an image including $0^{th}$ diffraction order and $\pm 1^{st}$ diffraction orders, onto a material, wherein the method comprises the steps of fabricating a phase shifting mask comprising at least one feature, wherein at least one feature includes halftoned phase-shifted transparent features; and off-axis illuminating the mask such that light passes through the mask onto the material. Preferably, one feature further includes semi/transparent features. Still preferably, the at least one feature further includes opaque features.

In yet another aspect, the invention features a phase shifting mask comprising at least two unattentuated, halftoned, phase-shift features having a width w, wherein the features are separated by a width w, such that the mask provides an image including $0^{th}$ diffraction order and $\pm 1^{st}$ diffraction orders, when illuminated.

In still yet another aspect, the invention features a phase shifting mask comprising at least two halftoned phase-shifted transparent features having a width w, wherein the features are separated by a width w, such that the mask provides an image including $0^{th}$ diffraction order and $\pm 1^{st}$ diffraction orders, when illuminated. Preferably, the at least two features further includes semi/transparent features. Still preferably, the at least two features further includes opaque features. Still yet preferably, a focus-exposure process window for maintaining a predetermined resist line-width sizing of the mask is common to an attentuated, phase-shift mask of a similar pitch.

As described in further detail below, the present invention provides significant advantages over the prior art. Most importantly, the unattenuated phase-shift photomask of the present invention allows for the printing of high resolution features, while manipulating the $0^{th}$ diffraction order and $\pm 1^{st}$ diffraction orders.

In addition, because the unattenuated phase-shift mask of the present invention provides a focus-exposure process window for maintaining an increased line-width sizing over that of the prior art.

Additional advantages of the present invention will become apparent to those skilled in the art from the following detailed description of exemplary embodiments of the present invention. The invention itself, together with further objects and advantages, can be better understood by reference to the following detailed description and the accompanying drawings.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 6(A) depicts a conventional on-axis exposure technique for mask fabrication.

FIG. 6(B) depicts a conventional off-axis exposure techniques for mask fabrication, wherein the reticle has an annular shape, or a quadrupole shape.

FIG. 7(A) depicts a cross-sectional view of a conventional non-phase shifting mask.

FIG. 7(B) depicts a cross-sectional view of a conventional phase shifting mask.

FIG. 7(C) depicts the corresponding diffraction spectrum for the conventional non-phase shifting mask of FIG. 7(A).

FIG. 7(D) depicts the corresponding diffraction spectrum for the conventional phase shifting mask of FIG. 7(D).

FIG. 10(A) depicts a cross-sectional view of a conventional transparent or chromeless shifter-shutter-type phase shifting mask.

FIG. 10(B) depicts a graph of the amplitude of the electric field at the conventional transparent or chromeless shifter-shutter-type phase shifting mask of FIG. 10(A).

FIG. 10(C) depicts the corresponding diffraction spectrum for the conventional transparent or chromeless shifter-shutter-type phase shifting mask of FIG. 10(A).

FIG. 18 depicts a halftone scattering bar assist feature in accordance with the present invention.

FIG. 19(B) is a graphical representation of the data represented in FIG. 19(A).

FIG. 19D illustrates how much exposure latitude (vertical axis) there is within a process window of a certain depth of focus (horizontal axis). In FIG. 19D, the top curve is for the 400 nm pitch and the lower curve is for the 600 nm pitch.

DETAILED DESCRIPTION OF THE INVENTION

In the following description, for the purposes of explanation, numerous specific details are set forth in order to provide a more thorough understanding of the present invention. It will be apparent, however, to one skilled in the art that the present invention may be practiced without these specific details.

Specifically, the following detailed description of the unattenuated phase-shift mask of the present invention relates to both the mask itself as well as a method of forming the mask. It is noted that in an effort to facilitate the understanding of the present invention, the following description details how the unattenuated phase-shift mask can be utilized to form features contained in today's state-of-the-art semiconductor devices. However, it is also noted that the present invention is not limited to use in semiconductor devices. Indeed, the present invention can be utilized in a multitude of different types of designs and processes that include the projection of high resolution images.

Figure 1:
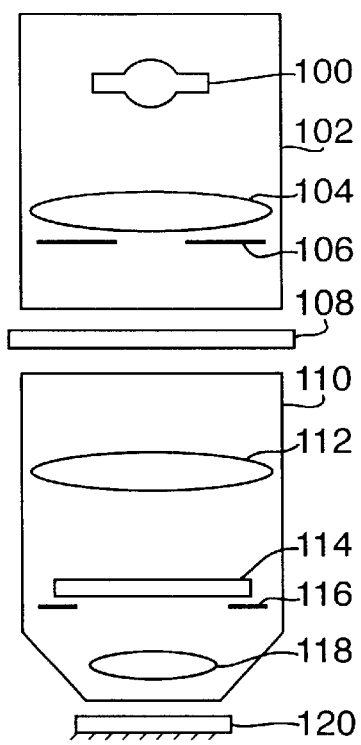
FIG. 1 depicts a prior art wafer stepper system.
Figure 2:
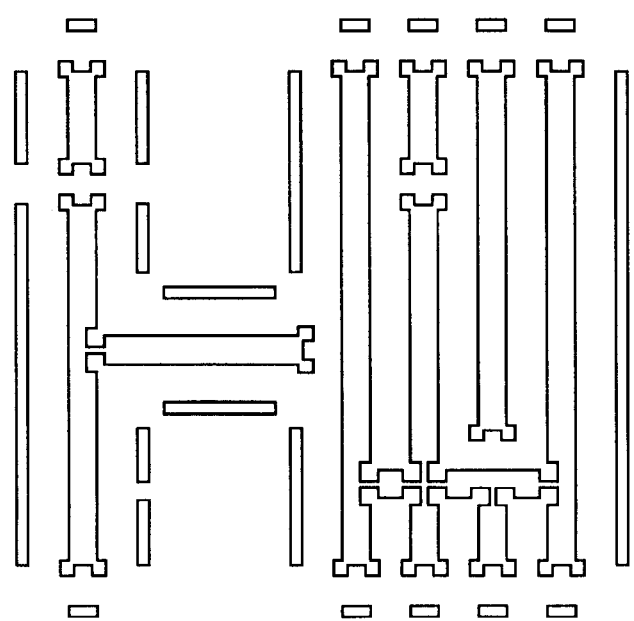
FIG. 2 depicts a photomask pattern applied with optical proximity correction features such as scattering bars and serifs.
Figure 3A:
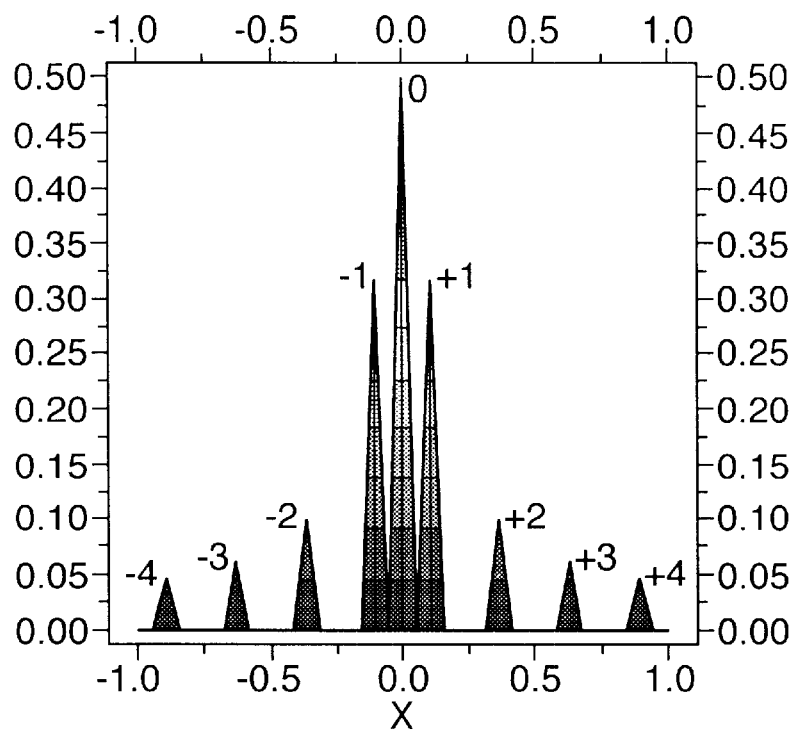
FIG. 3(A) depicts a diffraction spectrum for equal lines and spaces.
Figure 3B:
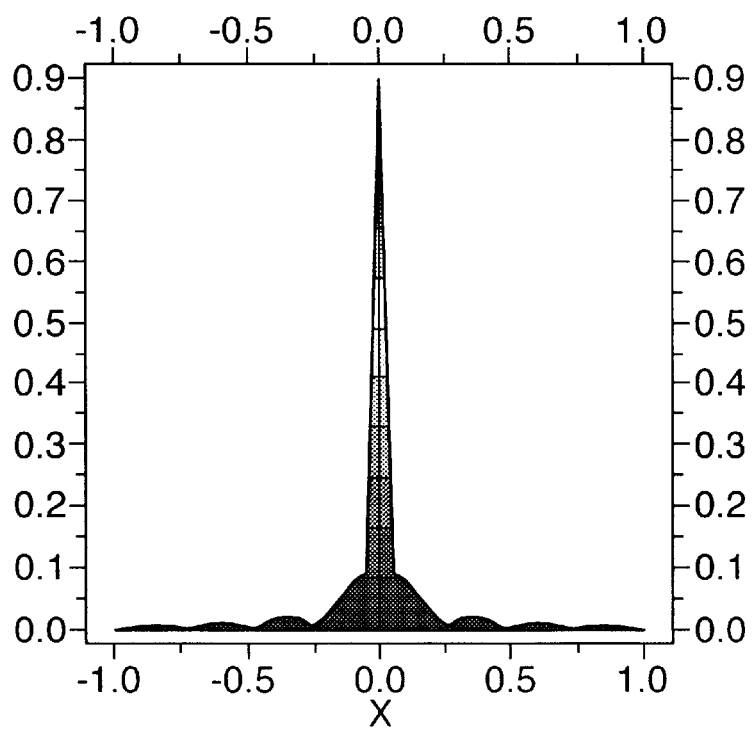
FIG. 3(B) depicts a diffraction spectrum for an isolated line.
Figure 4A:
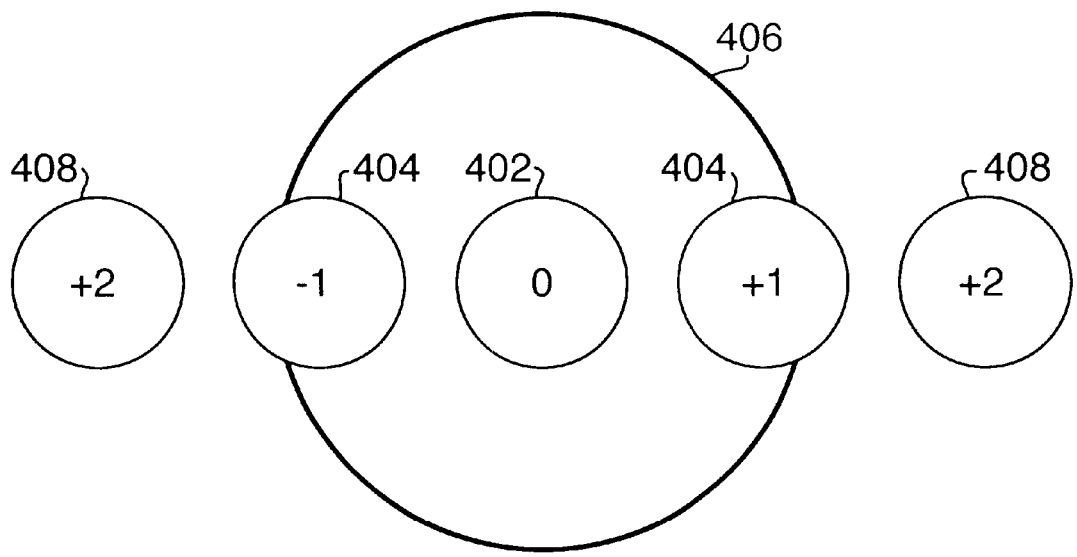
FIG. 4(A) depicts a diffraction spectrum of objects whose size is near the wavelength of the exposing energy.
Figure 4B:
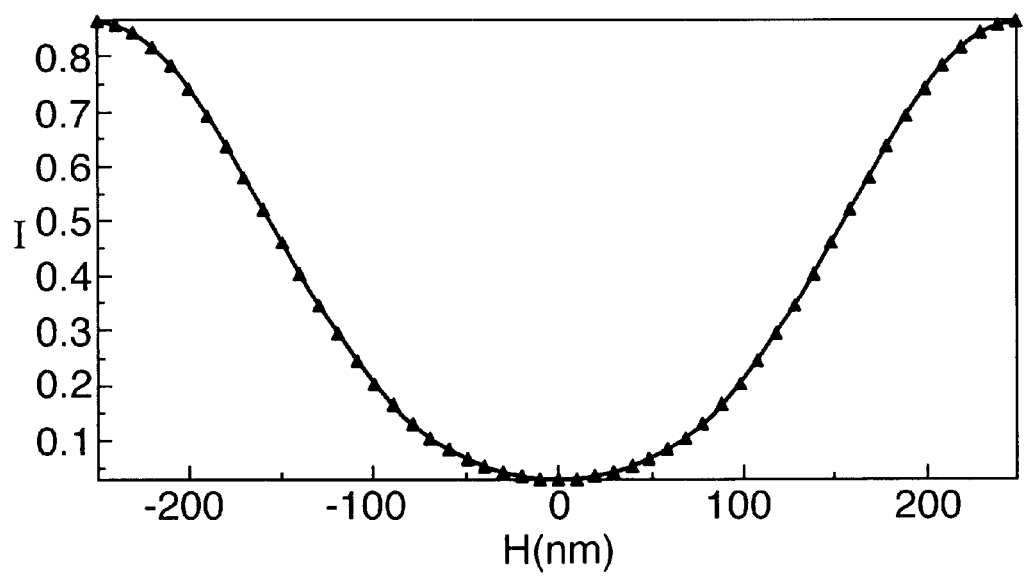
FIG. 4(B) depicts an aerial image of the diffraction spectrum of FIG. 4(A).
Figure 5A:
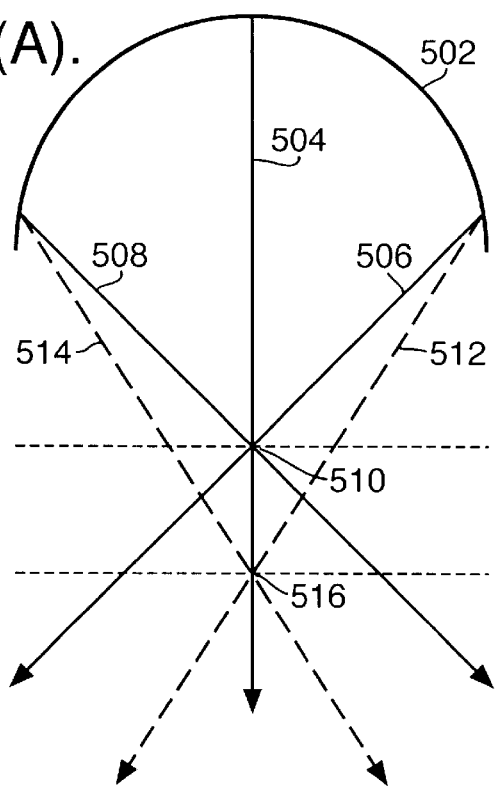
FIG. 5(A) depicts the effects of three-beam exposure in a conventional mask fabrication system.
Figure 5B:
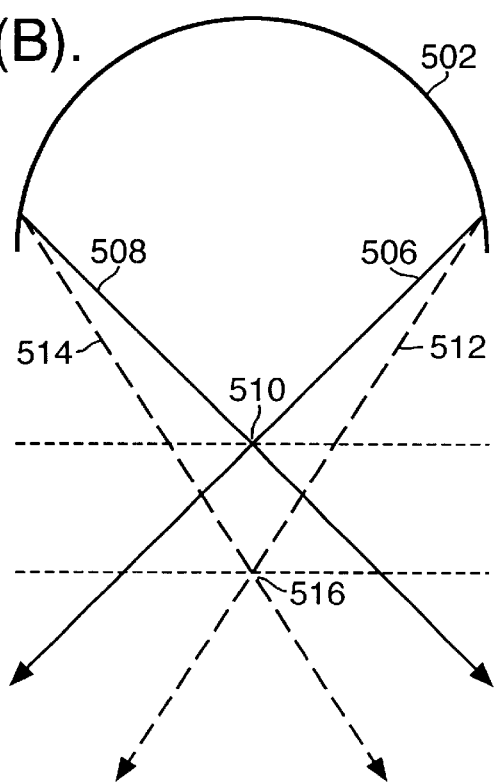
FIG. 5(B) depicts the effects of two-beam exposure in a convention mask fabrication system.
Figure 8A:
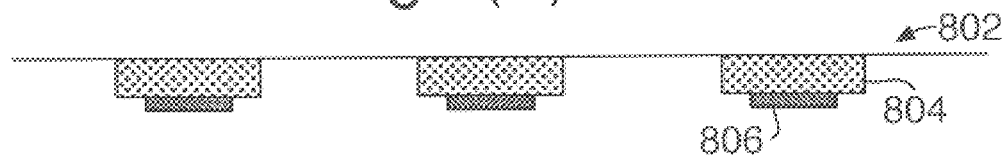
FIG. 8(A) depicts a cross-sectional view of a conventional rim-type phase shifting mask.
Figure 8B:
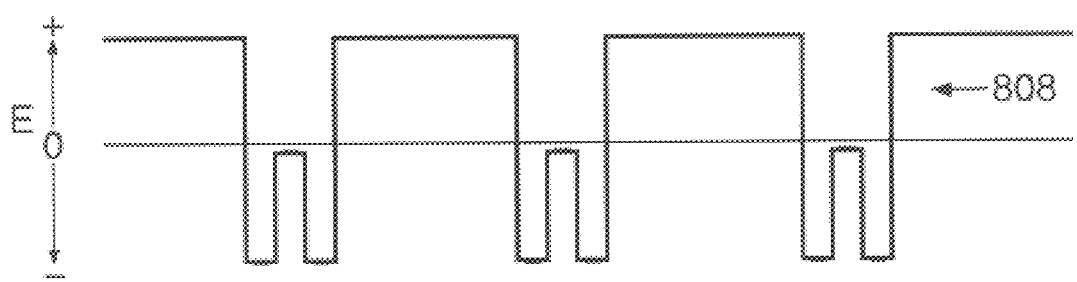
FIG. 8(B) depicts a graph of the amplitude of the electric field at the conventional rim-type phase shifting mask of FIG. 8(A).
Figure 8C:
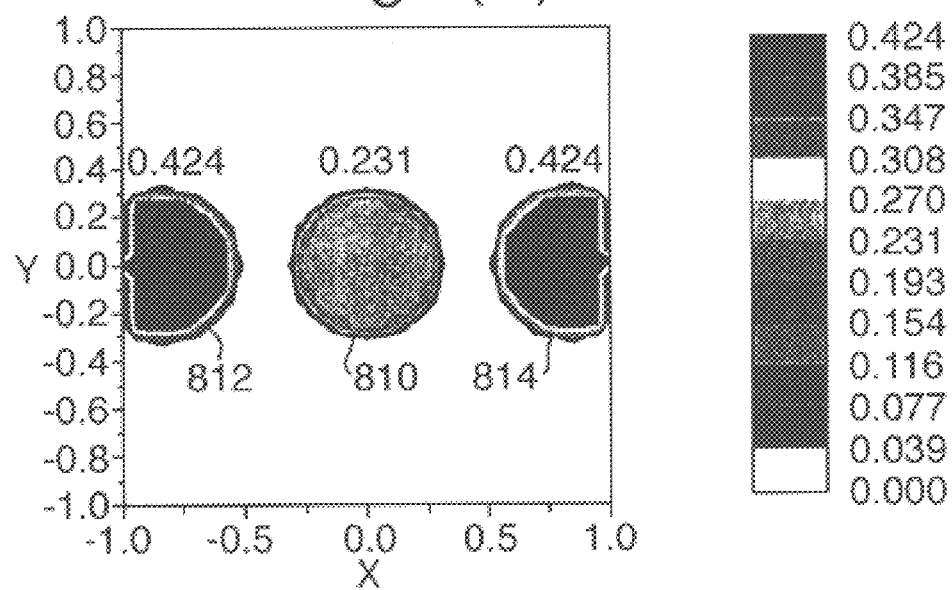
FIG. 8(C) depicts the corresponding diffraction spectrum for the conventional rim-type phase shifting mask of FIG. 8(A).
Figure 9A:
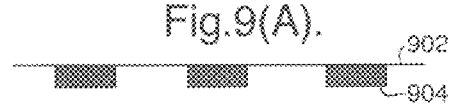
FIG. 9(A) depicts a cross-sectional view of a conventional attenuated-type phase shifting mask, having an attenuation factor of 5%.
Figure 9D:
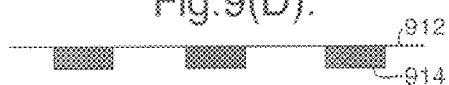
FIG. 9(D) depicts a cross-sectional view of a conventional attenuated-type phase shifting mask, having an attenuation factor of 10%.
Figure 9B:
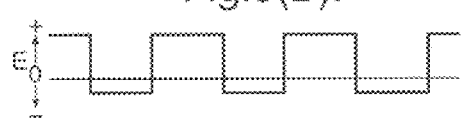
FIG. 9(B) depicts a graph of the amplitude of the electric field at the conventional attenuation-type phase shifting mask of FIG. 9(A).
Figure 9E:
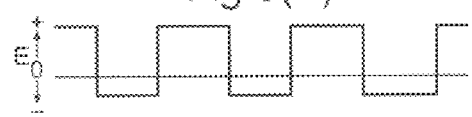
FIG. 9(E) depicts a graph of the amplitude of the electric field at the conventional attenuation-type phase shifting mask of FIG. 9(D).
Figure 9C:
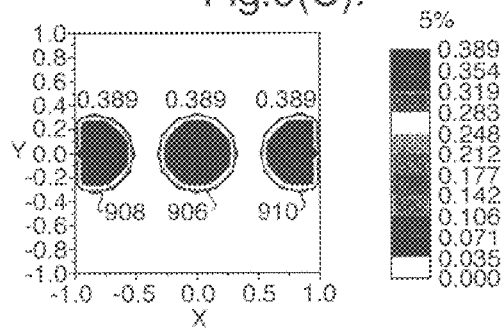
FIG. 9(C) depicts the corresponding diffraction spectrum for the conventional attenuation-type phase shifting mask of FIG. 9(A).
Figure 9F:
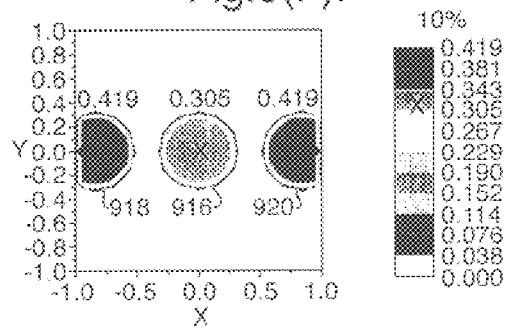
FIG. 9(F) depicts the corresponding diffraction spectrum for the conventional attenuation-type phase shifting mask of FIG. 9(D).
Figure 11A:
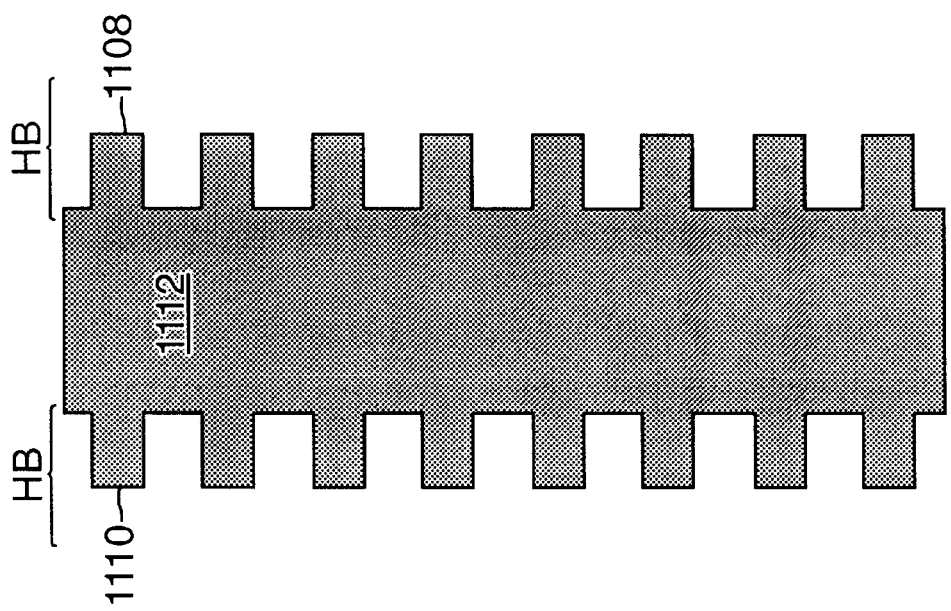
FIG. 11(A) depicts a conventional biased photomask.
Figure 11B:
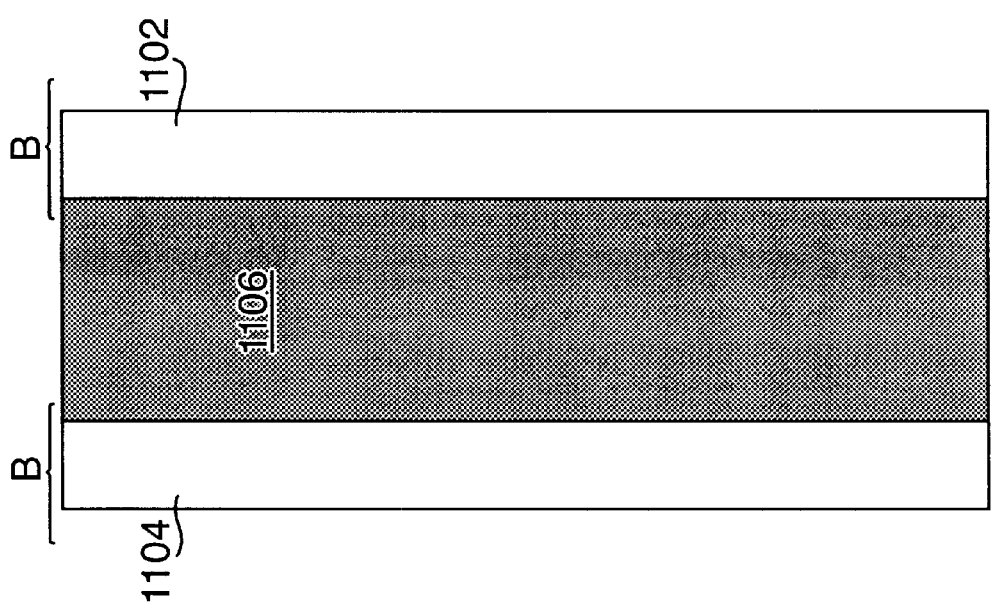
FIG. 11(B) depicts a halftone biased photomask.
Figure 12:
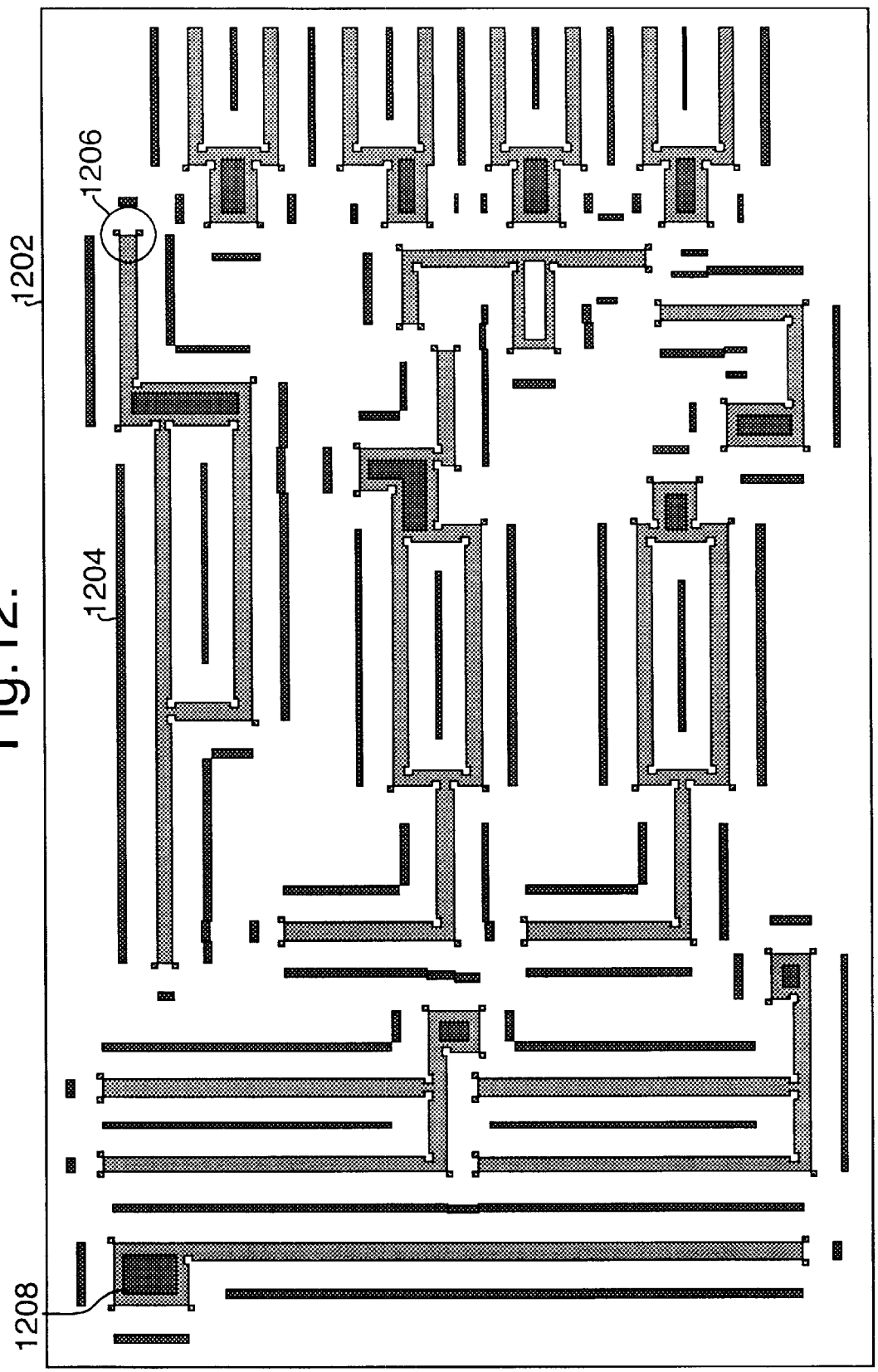
FIG. 12 depicts a conventional, attenuated phase-shifting, lithographic mask.
Figure 13A:
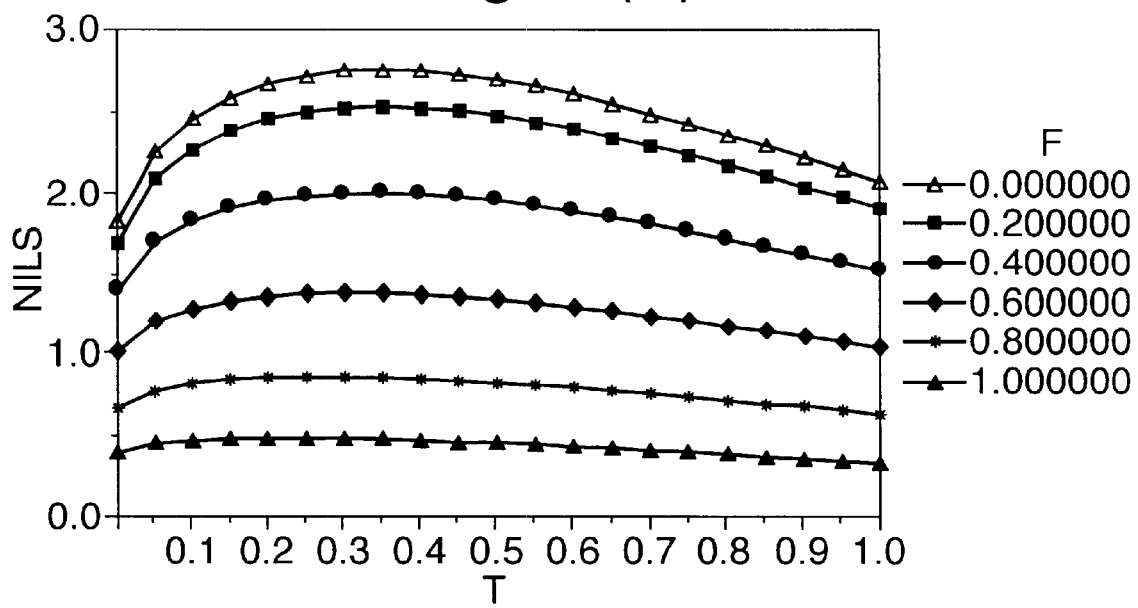
FIGS. 13(A) and 13(B) depict graphs of pitch dependence on percent transmission of a conventional attenuated phase-shifting mask, and the line-to duty cycle for different focus settings.
Figure 13B:
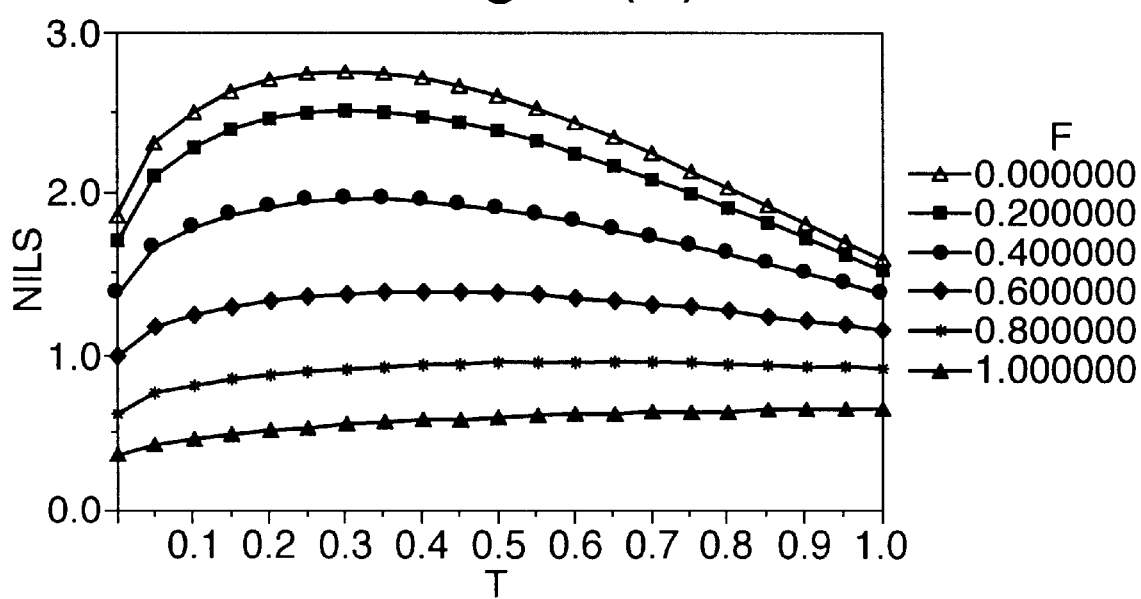
Figure 14A:
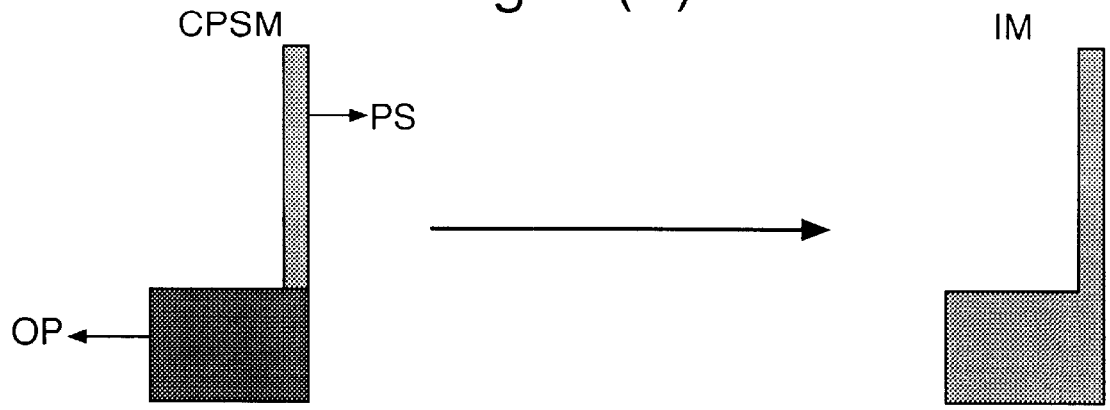
FIG. 14(A) depicts a conventional opaque feature and its corresponding image.
Figure 14B:
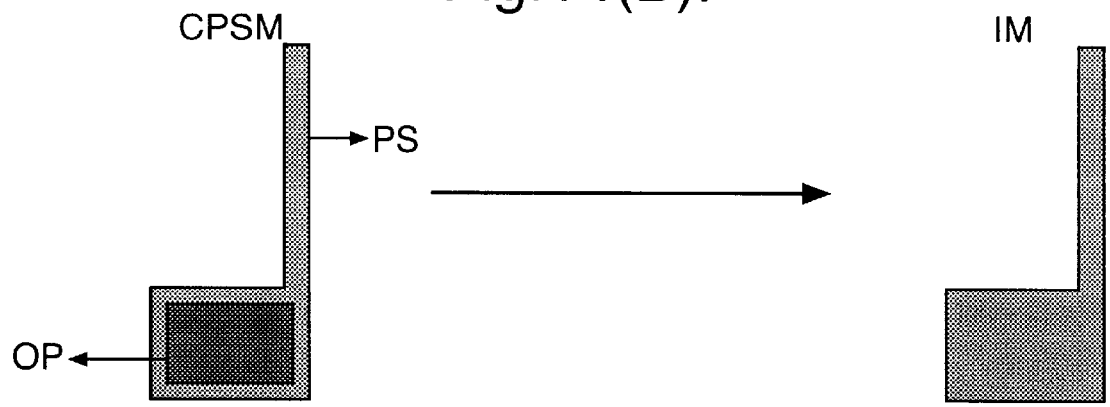
FIG. 14(B) depicts a conventional rim-shifted opaque feature and its corresponding image.
Figure 15:
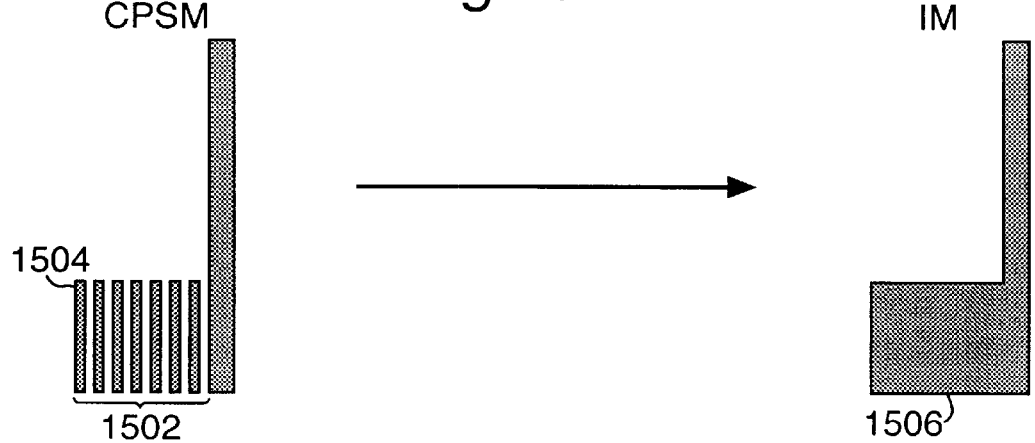
FIG. 15 depicts a conventional chromeless dark grating as an opaque feature and its corresponding image.
Figure 16A:
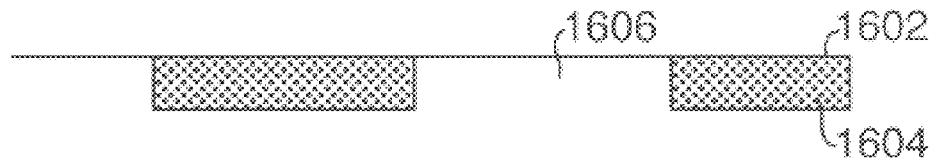
FIG. 16(A) depicts a cross-sectional view of a conventional chromeless phase-edge mask.
Figure 16B:
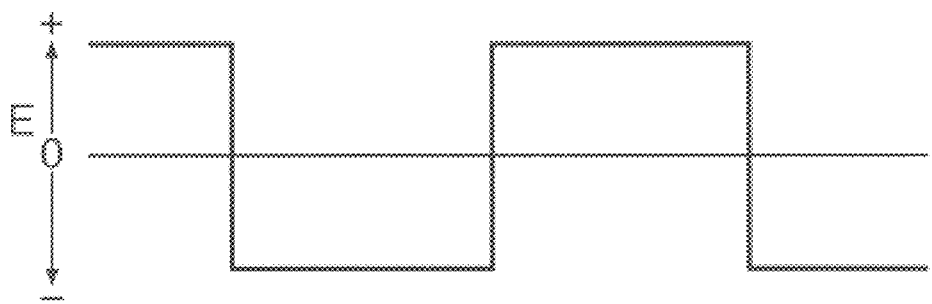
FIG. 16(B) depicts a graph of the amplitude of the electric field at the conventional transparent or chromeless phase-edge mask of FIG. 16(A).
Figure 16C:
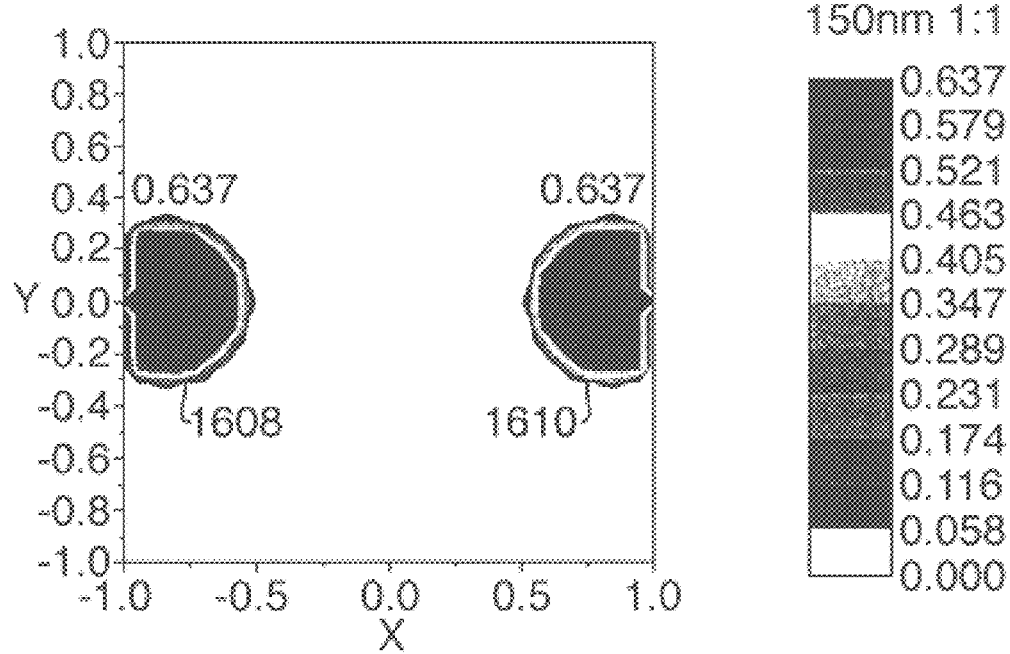
FIG. 16(C) depicts the corresponding diffraction spectrum for the conventional chromeless phase-edge mask of FIG. 16(A).
Figure 17A:
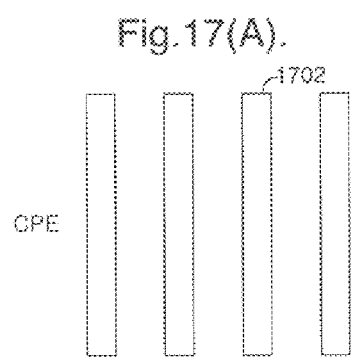
FIG. 17(A) depicts a primary feature in a phase-edge mask.
Figure 17B:
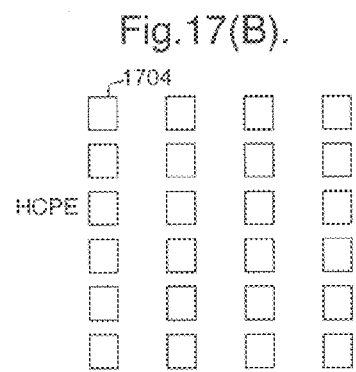
FIG. 17(B) depicts a halftone primary feature in a phase-edge mask in accordance with the present invention.
Figure 17C:
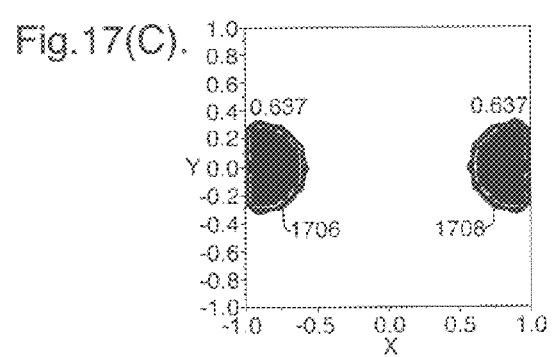
FIG. 17(C) depicts the corresponding diffraction spectrum for the phase-edge mask of FIG. 17(A).
Figure 17D:
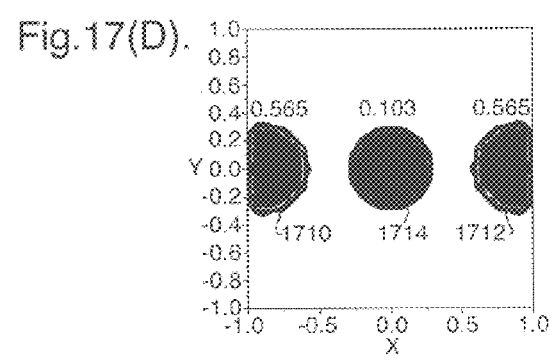
FIG. 17(D) depicts the corresponding diffraction spectrum for the phase-edge mask of FIG. 17(C).

A first exemplary embodiment of the present invention includes halftoning primary features of a chromeless shifter-shuttle phase-shifting mask. FIG. 17(A) shows halftoning of a primary feature so that it has an optimal $0^{th}$–$1^{st}$ diffraction order amplitude using a chromeless shifter-shuttle phase-shifting mask. FIG. 17(A) shows primary features 1702 before halftoning, whereas FIG. 17(B) shows the primary features 1704 after halftoning. FIGS. 17(C) and 17(D) depicts diffraction patterns of an equal line space chromeless pattern to that of the respective structures in FIGS. 17(A) and 17(B). As seen in FIG. 17(C), without halftoning, there is ±$1^{st}$ diffraction orders 1706 and 1708, however there is no $0^{th}$ diffraction order. On the other hand, as seen in FIG. 17(D), because of the halftoning of the primary features thereby permitting off-axis illumination for these dense features, there is ±$1^{st}$ diffraction orders 1710, 1712, and $0^{th}$ diffraction order 1714.

A second exemplary embodiment of the present invention includes halftoning scattering bar assist features of a chromeless shifter-shuttle phase-shifting mask. FIG. 18 depicts an example of a chromeless shifter-shuttle phase-shifting mask 1802, comprising halftoned scattering bar assist features 1806, and primary features 1804. Halftoning a scattering bar assist feature permits its associated primary feature have an optimal $0^{th}$–$1^{st}$ diffraction order amplitude using a chromeless shifter-shuttle phase-shifting mask.

Figure 19A:
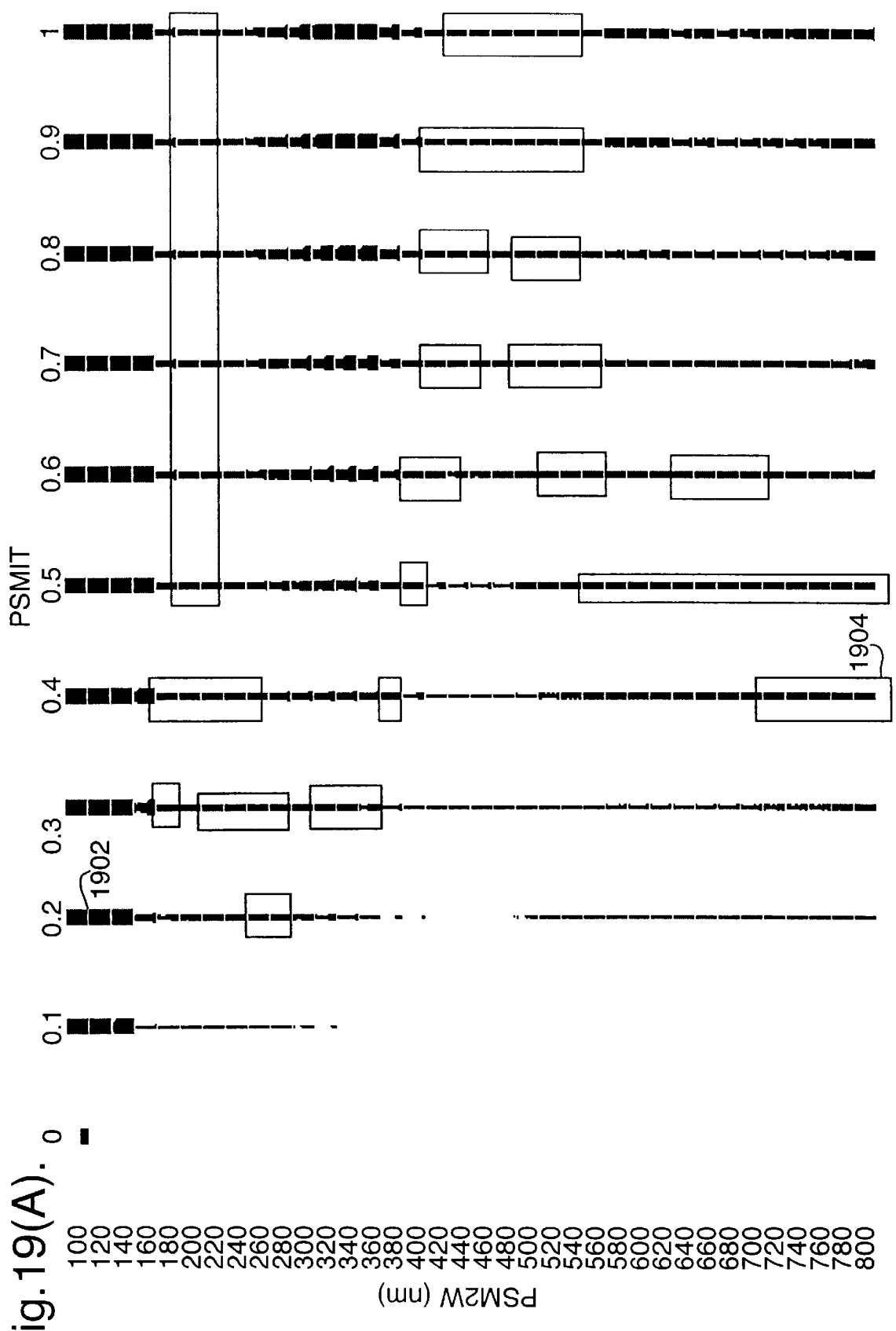
FIG. 19(A) is a diagram depicting simulated resist images for a plurality of conditions of pitch and transmission.

Examining features of varying pitch size imaged using phase-shifting masks show a pitch dependence on the transmission best suited for obtaining the same size resist image for a given exposure condition. FIGS. 19(A) and 19(B) show for 100 nm lines that are separated by spaces ranging in size from 100 nm to 800 nm, the transmission of the phase-shift required to produce a 100 nm line for each pitch.

More specifically, FIG. 19(A) shows the imaging result for different combinations of attenuated phase-shift mask transmittance and space sizes between 100 nm features. As seen in FIG. 19(A), figures 1902 at the intersections of each condition of transmittance and space size are simulated cross-sections of developed photoresist images that were exposed at 22 mJ/cm2 and −0.15 microns of focus using a 0.70 NA, 248 nm exposure tool with quadrupole illumination. The images 1904 surrounded by the boxes have a resist image size between 90 and 110 nm. These sizes are used here to arbitrarily derive the lower and upper limits for acceptable sizing. Images outside of the boxed areas do not meet this criterion. FIG. 19(B) is a graphical representation of the same data as represented in FIG. 19(A). As seen in FIGS. 19(A) and 19(B), in the range of 20 to 30% transmittance, the figures meet the sizing criteria of ±10% of 100 nm for the exposure condition of 22 mJ/cm2 and −0.15 microns of focus, for 400 nm pitch sizes and 600 nm pitch sizes, each having a transmission of 100%.

Figure 19C:
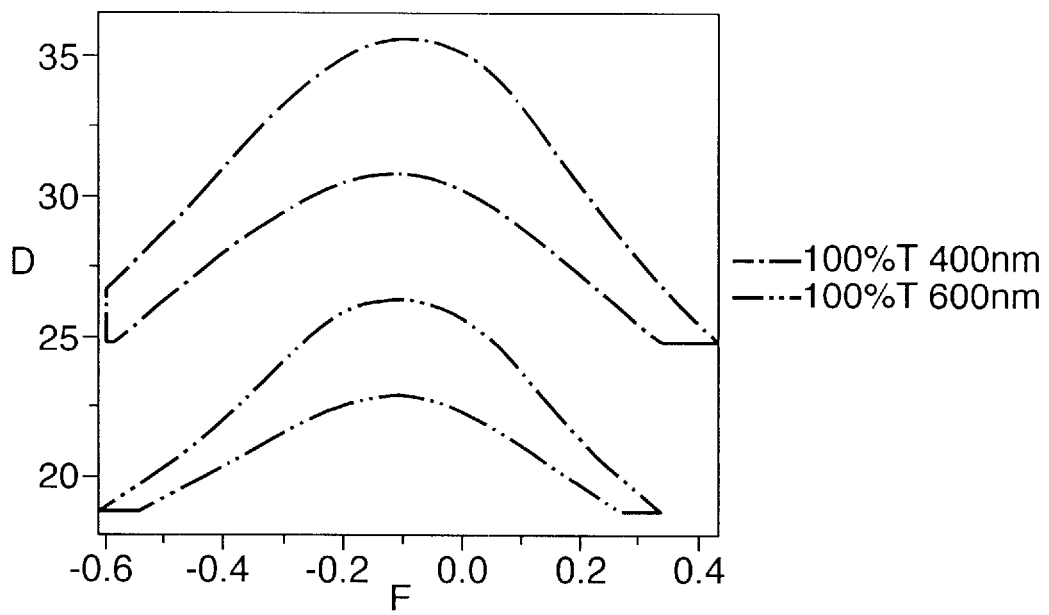
FIG. 19(C) is a contour plot showing the set of exposure (vertical axis) and focus (horizontal axis) conditions to size a 100 nm resist image between 90 nm and 110 nm. The two process windows in FIG. 19C are for a 400 nm pitch (upper contour) and for a 600 nm pitch (lower contour). These process windows do not overlap.
Figure 19D:
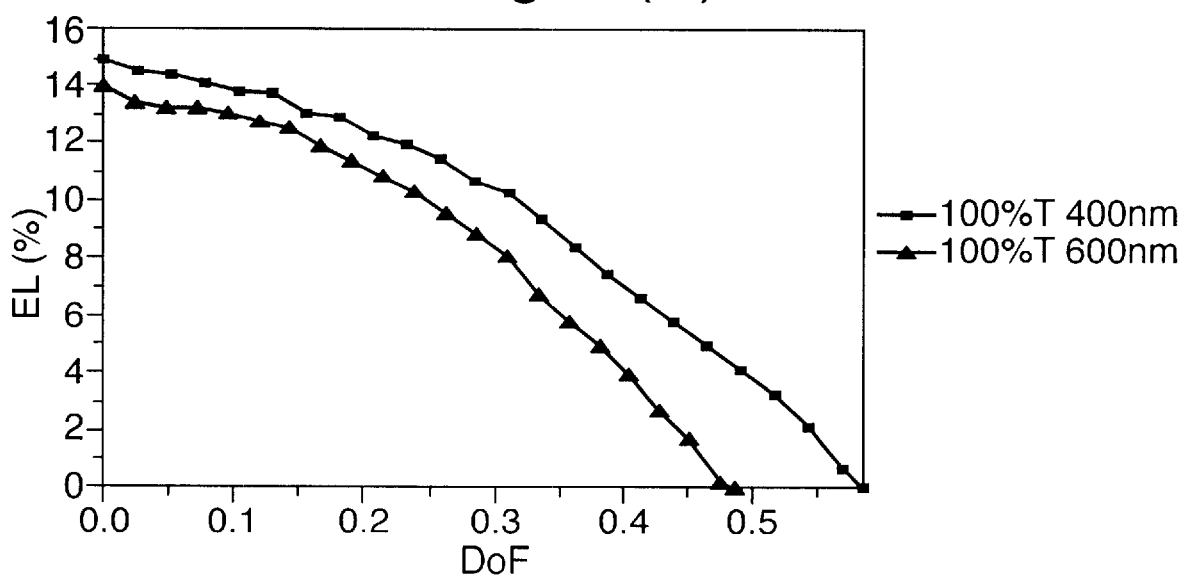
FIG. 19D is a different analysis of the same information shown in FIG. 19C.

FIG. 19(C) is a graph showing the focus-exposure process window for maintaining a specified line-width sizing for 600 nm and 400 nm pitch phase shift masks, each having 100% transmission. As seen in FIG. 19(C) the exposure and focus conditions for attaining 100 nm lines for 600 nm and 400 nm pitches are totally separate, with no common process corridor. FIG. 19(D) is a graph showing exposure latitude verses the depth of focus (DoF) for 600 nm and 400 nm pitch phase shift masks, each having 100% transmission. The exposure latitude is the range of exposure, that maintains ±10% feature sizing, divided by the exposure dose to size the feature, times 100. It is clear that as the exposure latitude decreases, the depth of focus increases for each pitch. However, as seen in FIG. 19(D), there is not a point in which both the 600 nm and 400 nm pitch phase shift mask share a common exposure latitude and corresponding depth of focus. As such, without correction in accordance with the present invention, a 600 nm and 400 nm pitch can not size a 100 nm resist line using the same conditions of exposure and focus.

FIGS. 19(A)–(D) represent simulated data corresponding to photomasks. Only 10% and 100% attenuated PSM are conventionally available for commercial applications, whereas higher transmissions may be custom produced. As such, there are limited materials available to produce masks. Further different pitch structures may not perform optimally on such limited available materials. Still further, one material would never be optimal for the plurality of structures to be found on a set of patterns found on a single conventional mask. Therefore, the present invention removes these barriers because the present invention provides a method of halftoning primary and assist features to emulate the diffraction pattern of any of the prior art phase shifting masks. Specifically, the present invention permits different pitch structures to perform optimally on a single mask.

The following describes the invention method to solve the problem described with respect to FIGS. 19(A) through 19(D).

Halftoning may be used to permit a unattenuated, 100% chromeless mask to produce a diffraction pattern and resultant aerial image that emulates a diffraction pattern and resultant aerial image corresponding to a 26% transparent, attenuated phase-shift mask. This is a hypothetical example because 26% attenuated material does not commercially exist in mass quantities. Nevertheless, it is an optimum transmission for some features and the present invention makes a halftoned chromeless phase-shift mask that match the performance of the 26% attenuated material. As such, the optimum transmission is attainable without attenuating the image with the prior art attenuated masks.

Figure 20A:
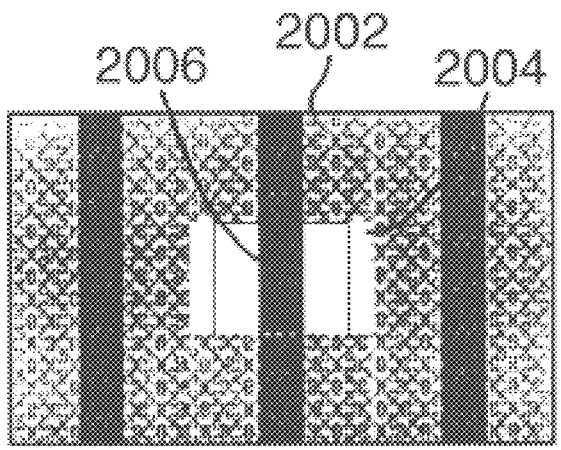
FIG. 20(A) depicts layout for a 26% transmittance attenuated phase-shifting mask.
Figure 20B:
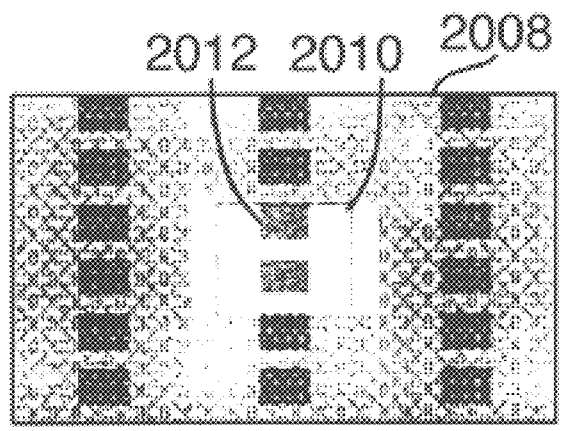
FIG. 20(B) depicts a layout for an unattenuated, chromeless phase-shifting mask that has been halftoned, in accordance with the present invention, to make its diffraction pattern similar to that of the 26% attenuated mask of FIG. 20(A).
Figure 20C:
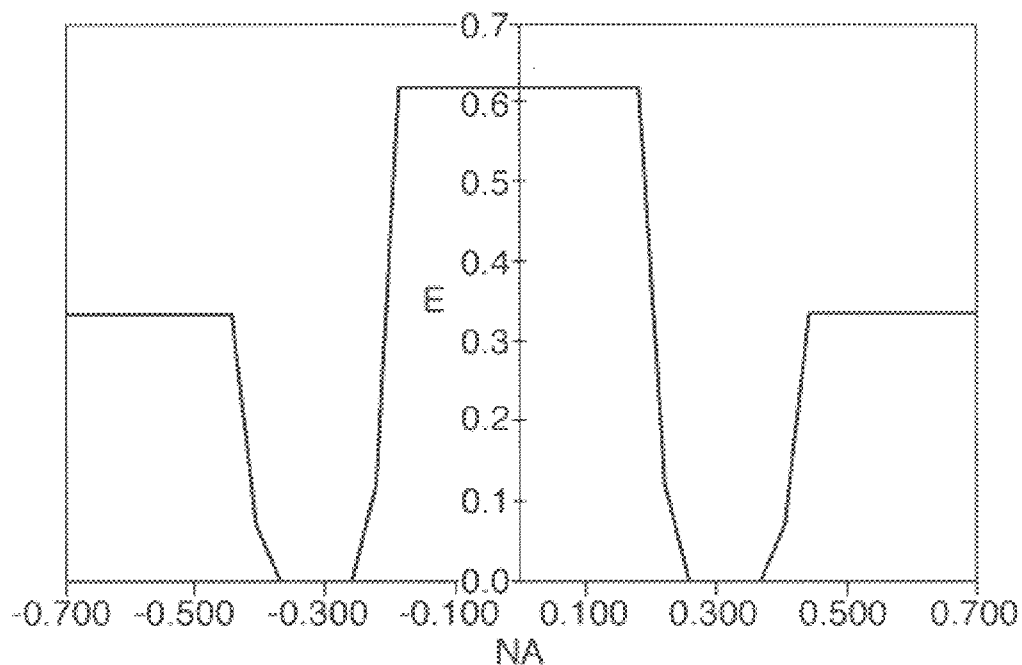
FIG. 20(C) is a graphical comparison of the diffraction orders produced by the mask of FIG. 20(A) and the mask of FIG. 20(B).
Figure 20D:
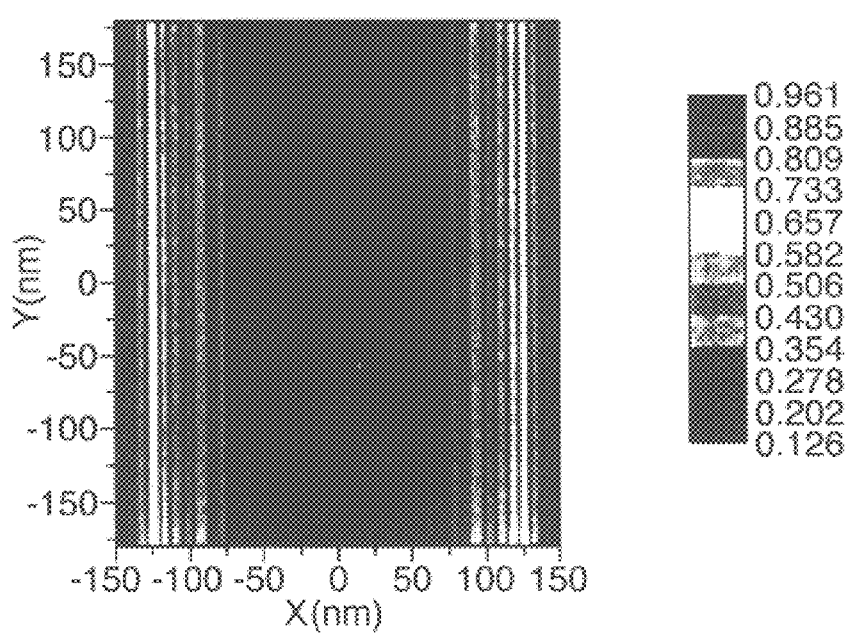
FIG. 20(D) is an aerial image of mask of FIG. 20(C).

FIGS. 20(A) through 20(D) represent how an attenuated phase-shifting mask is fabricated from an unattenuated, chromeless phase-shifting mask in order to image, in this example, a 100 nm line of a 400 nm-pitch feature the same way as if an unattenuated, chromeless phase-shifting mask were used. FIG. 20(A) depicts a primary feature 2006 in a portion 2004 of a mask layout 2002 for a 26% transmittance attenuated phase-shifting mask. FIG. 20(B) depicts halftoning objects 2012 in a portion 2010 of a mask layout 2008 for an unattenuated, chromeless phase-shifting mask that has been halftoned thereby rendering a diffraction pattern near perfectly similar to that of the 26% attenuated mask of FIG. 20(A). FIG. 20(C) is a graph comparing the diffraction orders produced by both portions 2004 and 2010 of the attenuated and the halftoned, unattenuated masks respectively. FIG. 20(D) is an aerial image of the halftone mask of FIG. 20(B), wherein the aerial image shows no signs of the discrete halftoning objects.

Figure 20E:
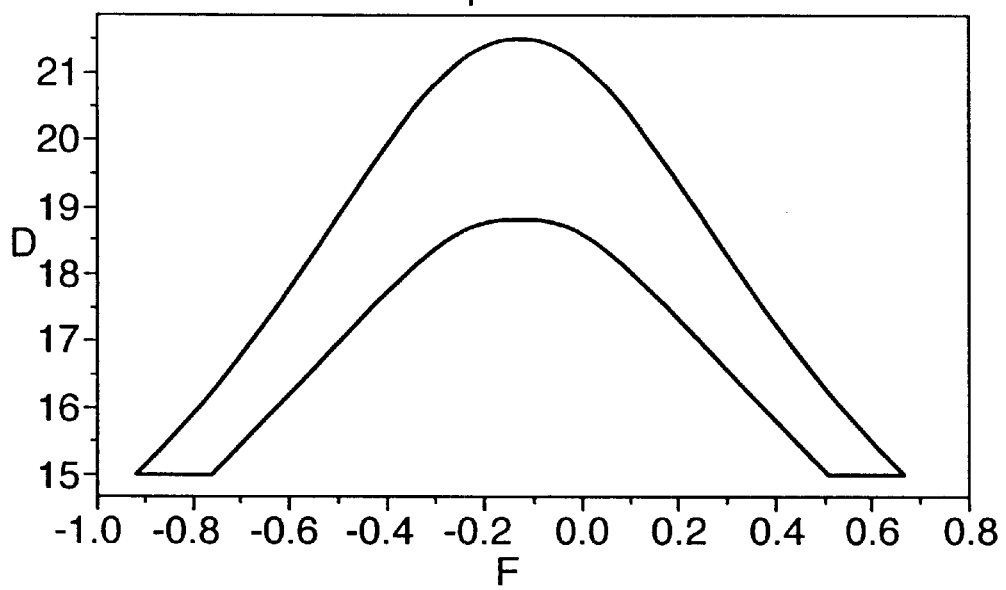
FIG. 20(E) is a graphical representation of the focus-exposure process window for maintaining a specified linewidth sizing for the mask of FIG. 20(A).
Figure 20F:
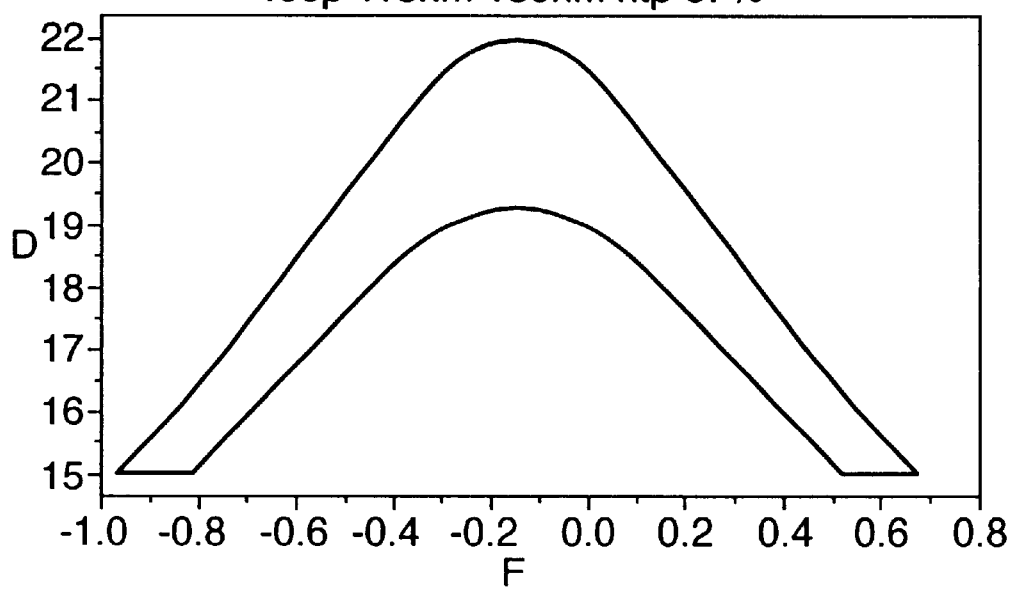
FIG. 20(F) is a graphical representation of the focus-exposure process window for maintaining a specified linewidth sizing for the mask of FIG. 20(C).
Figure 20G:
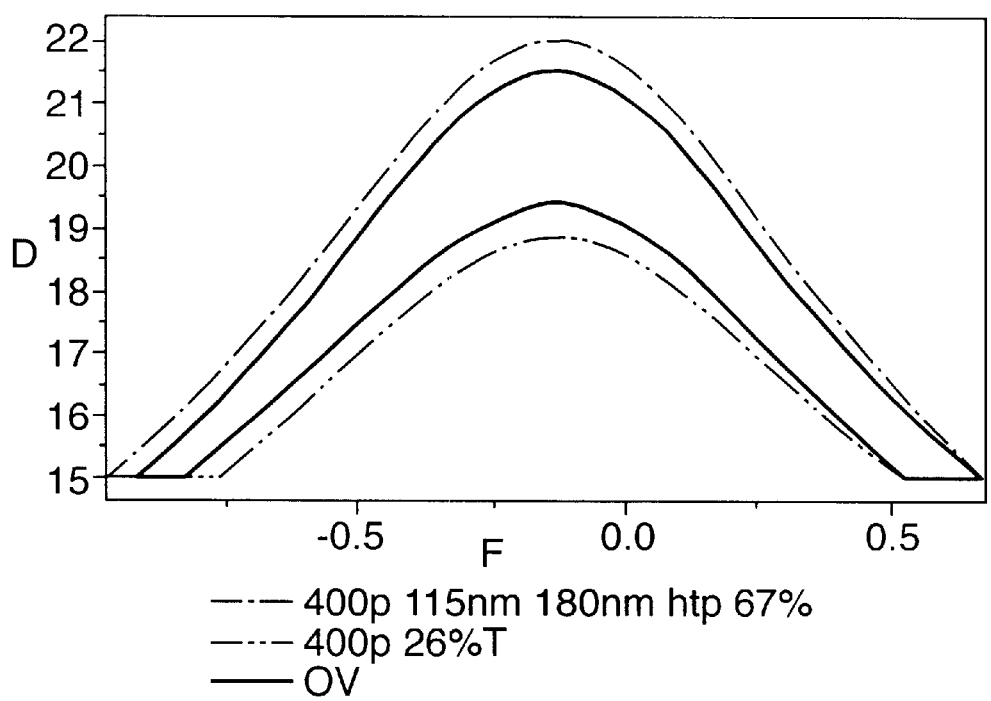
FIG. 20(G) is a graphical representation of the percent exposure latitude for both masks of FIG. 20(A) and FIG. 20(B) respectively.
Figure 20H:
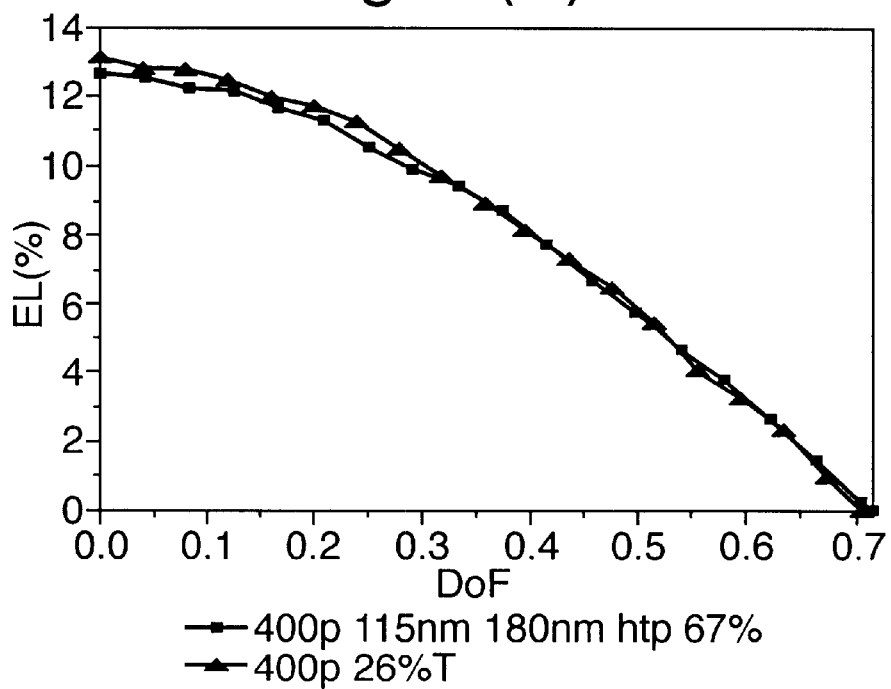
FIG. 20(H) is a graphical representation of the percent exposure latitude for both masks of FIG. 20(A) and FIG. 20(B) respectively.

FIGS. 20(E) and 20(F) illustrate graphs showing the focus-exposure process window for maintaining 90 nm to 110 nm resist line-width sizing in the 26% transmittance attenuated phase-shifting mask of FIG. 20(A), and the halftone unattenuated, chromeless phase-shifting mask of FIG. 20(B) respectively. FIG. 20(G) is a graphical representation of the focus-exposure process window for maintaining a specified line-width sizing for both masks of FIG. 20(A) and FIG. 20(B). As seen in FIG. 20(G), there is an overlapping portion of the graph for both masks of FIG. 20(A) and FIG. 20(B). Further, as seen in FIG. 20(H), the percent exposure latitude for both masks is relatively similar. Therefore, as evidenced by FIGS. 20(G) and 20(H), the halftone unattenuated, chromeless phase-shifting mask of FIG. 20(B) may be used to emulate a 26% transmittance attenuated phase-shifting mask of FIG. 20(A).

In this exemplary embodiment, emulating a 26% attenuated-like phase-shift mask, such depicted in FIG. 20(A), with a 100% chromeless phase-shift mask, such as depicted in FIG. 20(B), included increasing the width of the 100 nm line to 115 nm and halftoning the line using a 180 nm-halftone pitch with a 67% duty cycle of 180° shifter to non-shifter region. The halftone has a region that is shifted relative to region that is not. In this exemplary embodiment, a 67% halftone duty cycle means that 67%, or 120 nm, has been modified to be 180° phase-shifted and 33% or 60 nm is an unmodified 0° reference area.

Figure 21A:
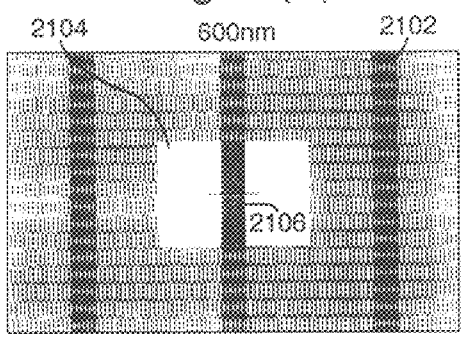
FIGS. 21(A) and 21(b) depict conventional chromeless phase-shift patterns.
Figure 21B:
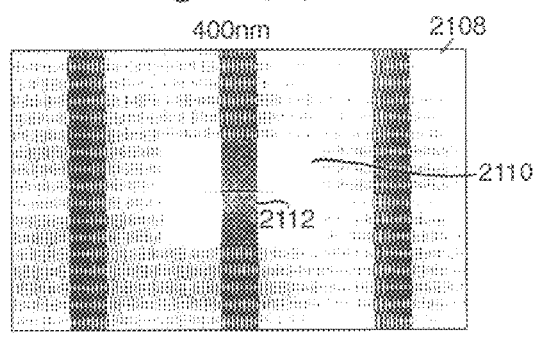

FIGS. 21(A) through 21(J) show how two features that have different optimal transmissions for image quality can be halftoned so that they have optimal imaging capability using the same attenuated phase-shifting material. FIG. 21(A) depicts a primary feature 2106 in a portion 2104 of a mask layout 2102 for a 600 nm pitch chromeless phase-shifting mask. FIG. 21(B) depicts a primary feature 2112 in a portion 2110 of a mask layout 2108 for a 400 nm pitch chromeless phase-shifting mask.

Figure 21C:
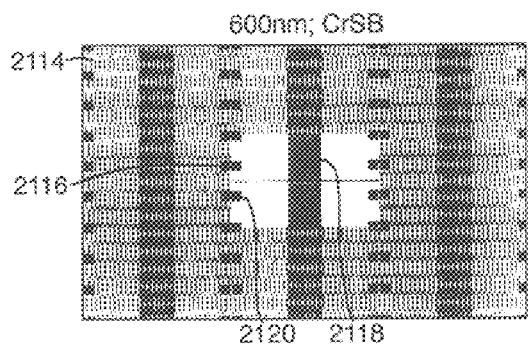
FIGS. 21(C) and 21(D) depict halftone chromeless phase-shift patterns in accordance with the present invention, corresponding to the phase-shift patterns of FIGS. 21(A) and 21(B) respectively.
Figure 21D:
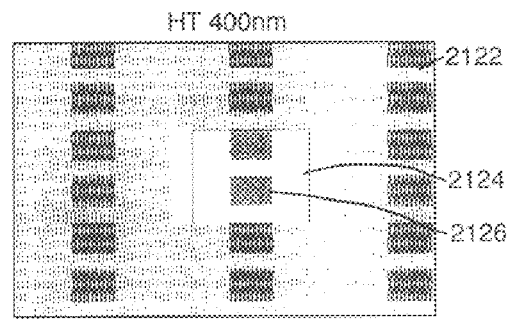
Figure 21E:
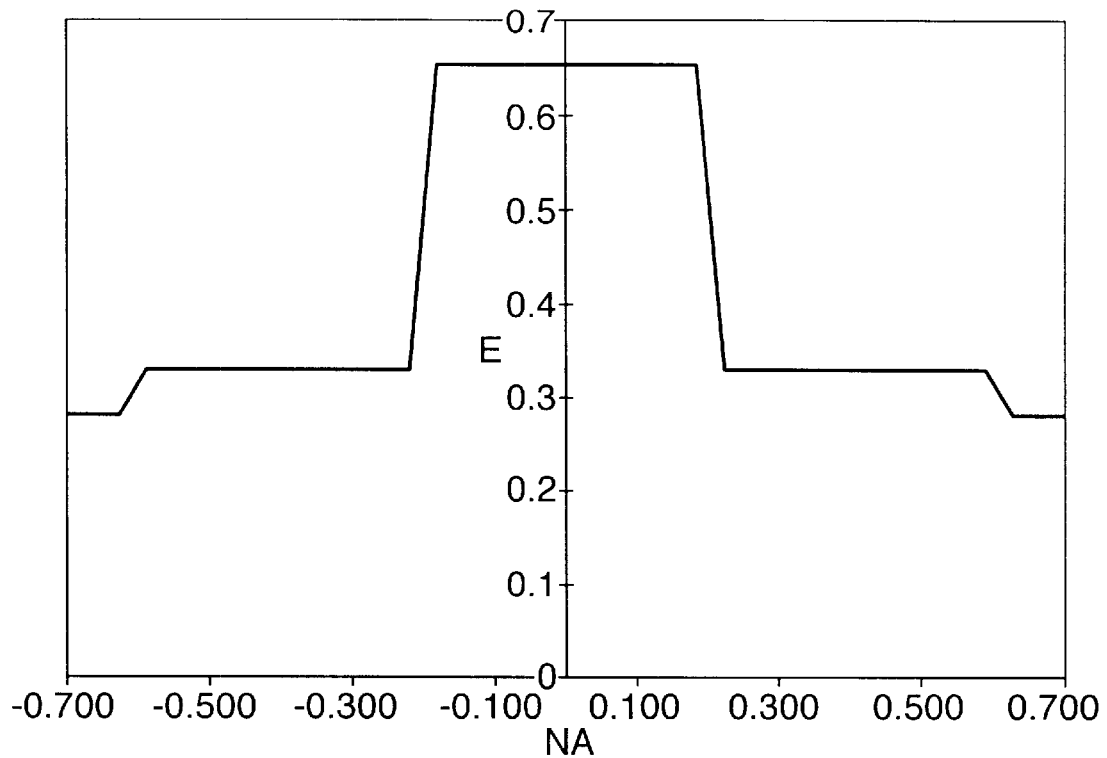
FIGS. 21(E) through 21(H) depict diffraction patterns for the object pattern of the phase-shift patterns of FIGS. 21(A) through 21(D) respectively.
Figure 21F:
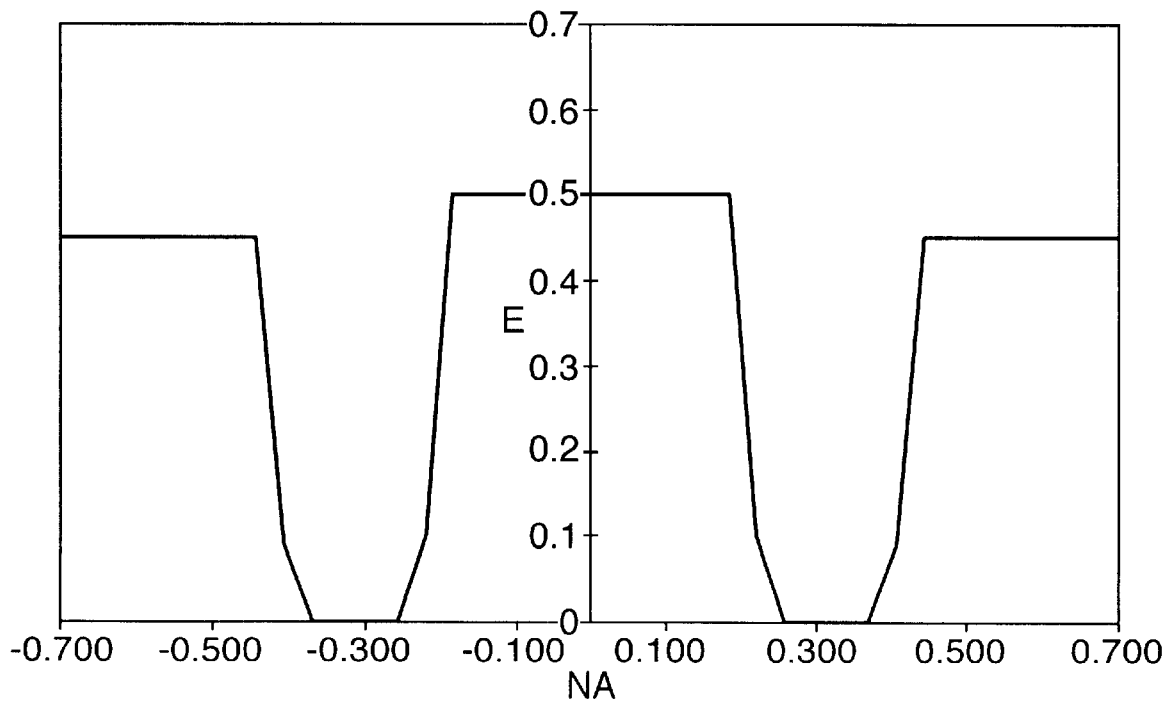

FIG. 21(C) depicts a primary feature 2118 and halftoning scatter bar 2120 in a portion 2116 of a mask layout 2114 for a 600 nm pitch unattenuated phase-shifting mask. The line-width of primary feature 2118 is increased over that of primary feature 2106 of FIG. 21(A). Similarly, FIG. 21(D) depicts a halftone primary feature 2126 in a portion 2124 of a mask layout 2122 for a 400 nm pitch unattenuated phase-shifting mask, wherein the line-width of halftone primary feature 2126 is increased over that of primary feature 2112 of FIG. 21(B). The masks depicted in FIG. 21(A) and FIG. 21(B) have been modified to result in the masks depicted in FIG. 21(C) and FIG. 21(D) respectively.

Figure 21G:
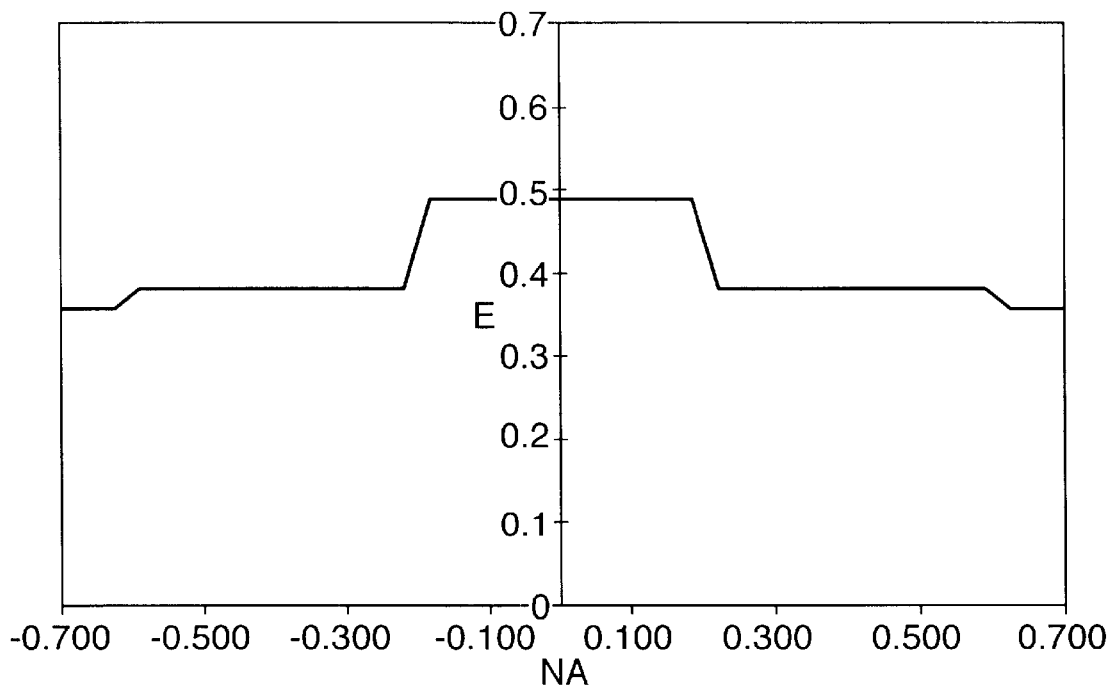
Figure 21H:
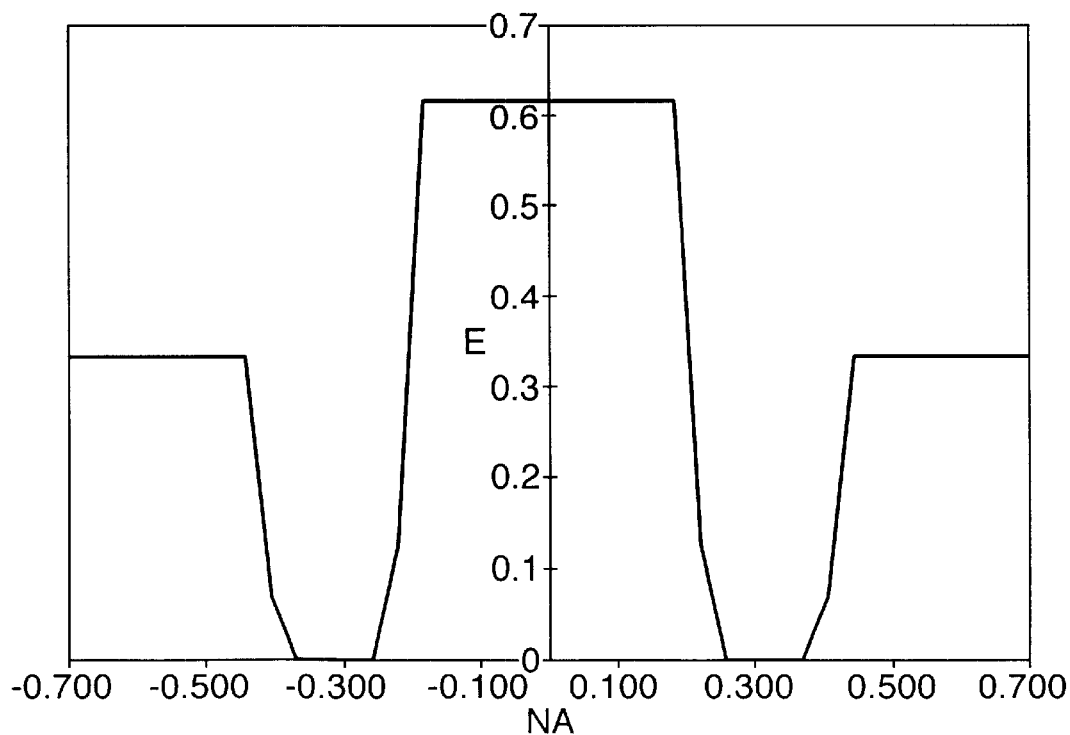

FIGS. 21(E) through 21(H) shows the diffraction patterns corresponding to the mask patterns of FIGS. 21(A) through 21(D) respectively. FIG. 21(G) and FIG. 21(H) show the modified diffraction patterns corresponding to the mask patterns FIG. 21(C) and FIG. 21(D). As compared to the diffraction patterns illustrated in FIG. 21(E) and FIG. 21(F), the diffraction patterns are modified when the original mask patterns illustrated in FIG. 21(A) and FIG. 21(B) are modified to become the mask patterns illustrated in FIG. 21(C) and FIG. 21(D) respectively.

Figure 21I:
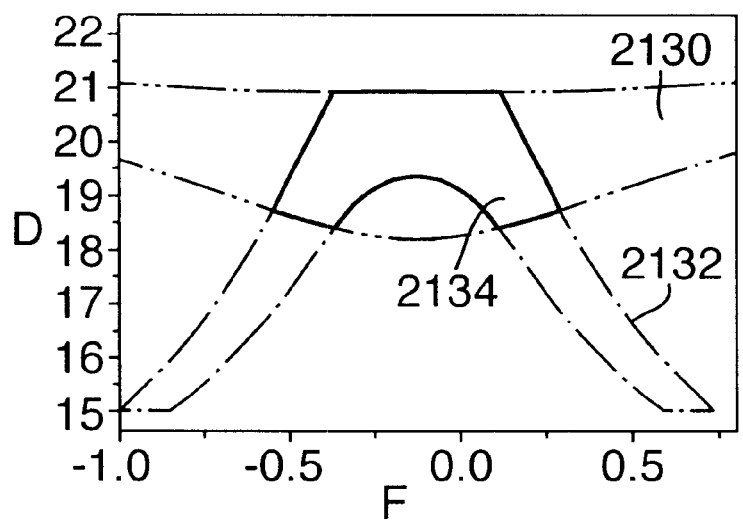
FIG. 21(I) shows the focus-exposure process windows for a 100 nm line with pitches of 400 nm (2134 and 2132) and 600 nm (2130) for masks that used the appropriate halftoning (FIG. 21D for the 400 nm pitch and FIG. 21C for the 600 nm pitch) to make the features size with similar exposure and focus. For the 400 nm pitch the total process window includes areas 2134 and 2132, with 2134 overlapping with the 600 nm pitch process window, 2130. The ellipse inside represents one of set of exposure and focus conditions that could be maintained during an actual exposure process to yield ±10% of the 100 nm line size.
Figure 21J:
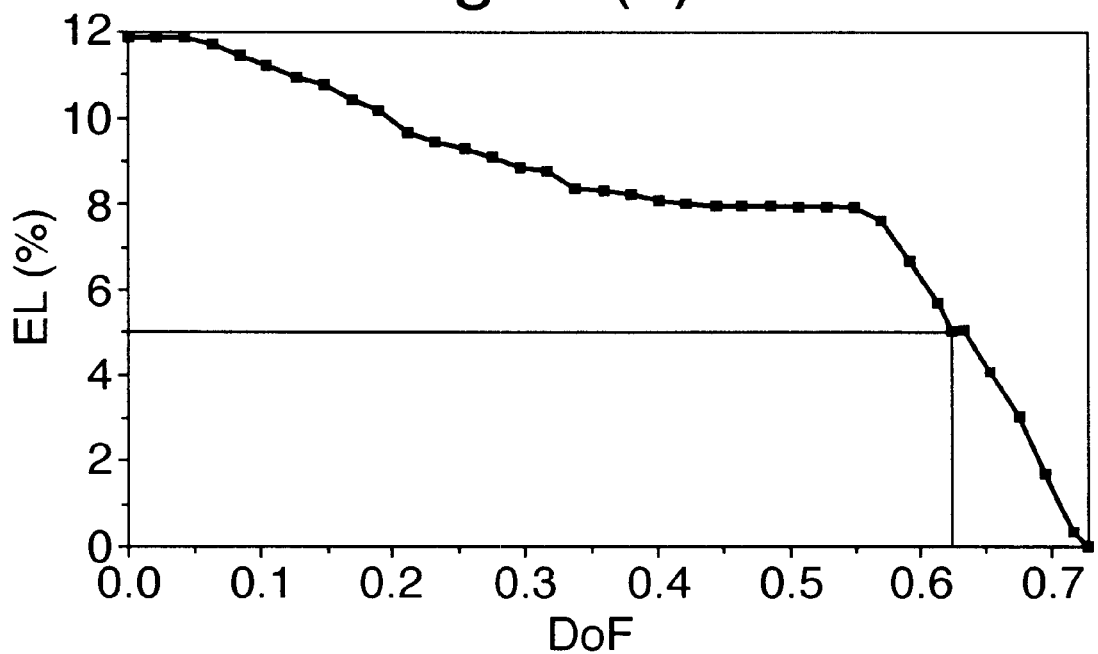
FIG. 21J shows the exposure latitude for varying amounts of depth of focus for the common focus-exposure area 2134.

FIG. 21(I) shows that a common focus-exposure corridor for both mask patterns of FIGS. 21(C) and 21(D). As seen in FIG. 21(I) the focus-exposure process window 2130 for the mask of FIG. 21(C) overlaps the focus-exposure process window 2132 for the mask of FIG. 21(D) at a common focus-exposure process window 2134. This simulation example shows that a halftoned unattenuated chromeless mask may emulate an attenuated phase-shift mask of lower transmittance.

Figure 22A:
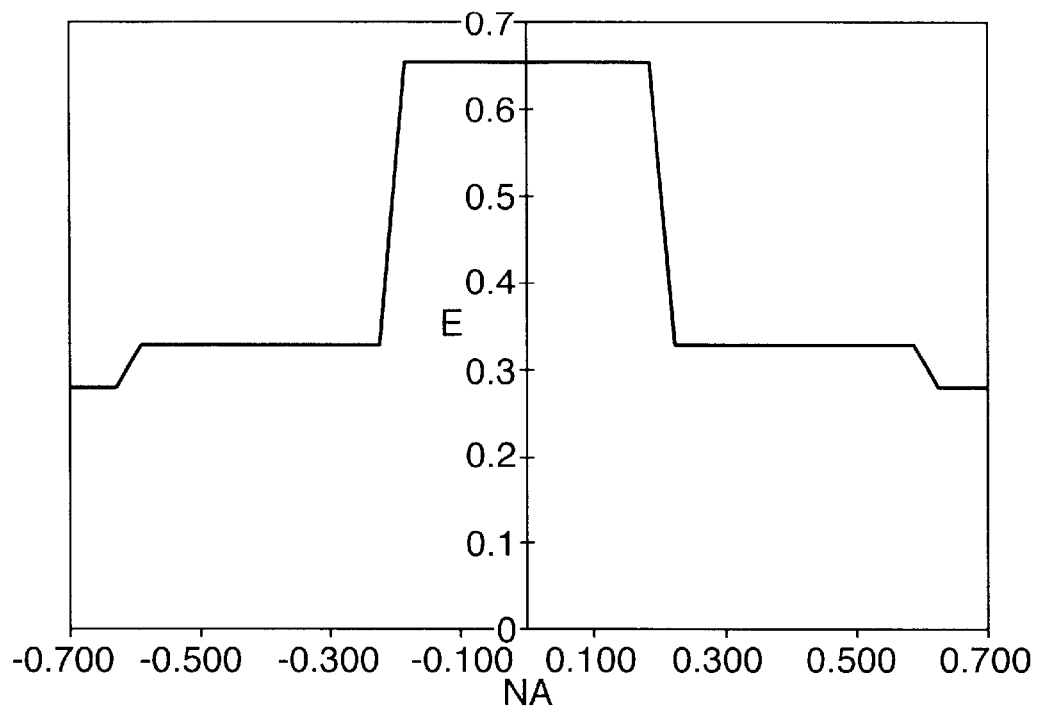
FIG. 22(A) depicts a diffraction pattern for the object pattern of a conventional phase-shift pattern.
Figure 22B:
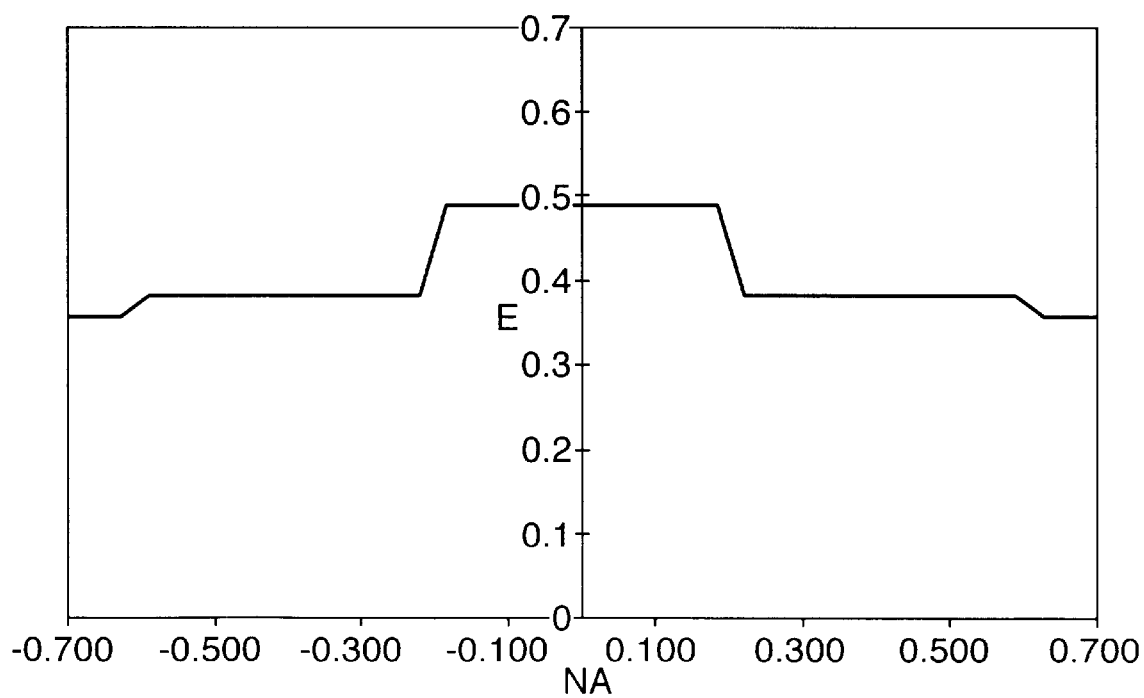
FIG. 22(B) depicts a diffraction pattern for the object pattern of a halftone phase-shift pattern in accordance with the present invention.
Figure 22C:
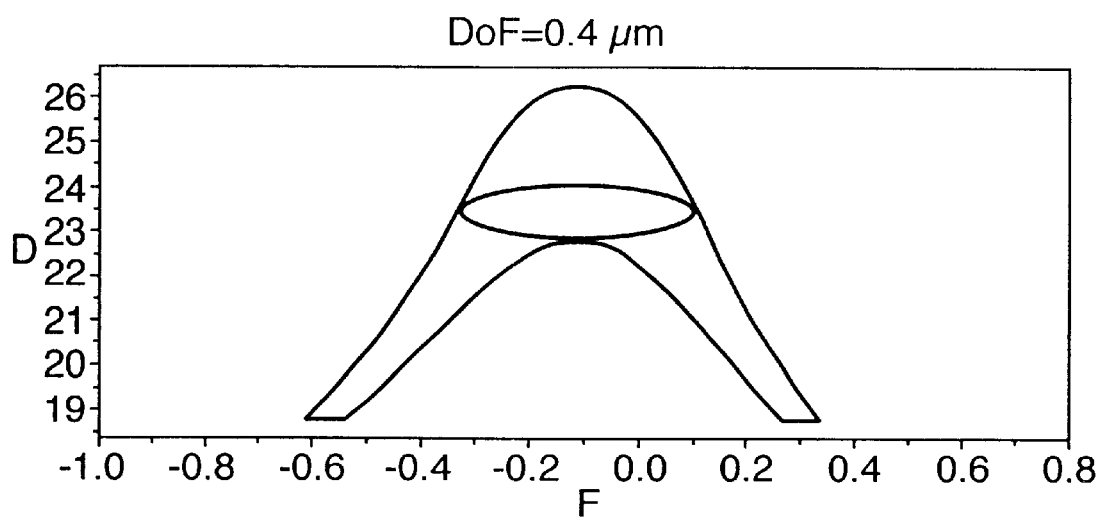
FIG. 22(C) is a graphical representation of the focus-exposure process window for maintaining a specified line-width sizing for the mask of FIG. 22(A).
Figure 22D:
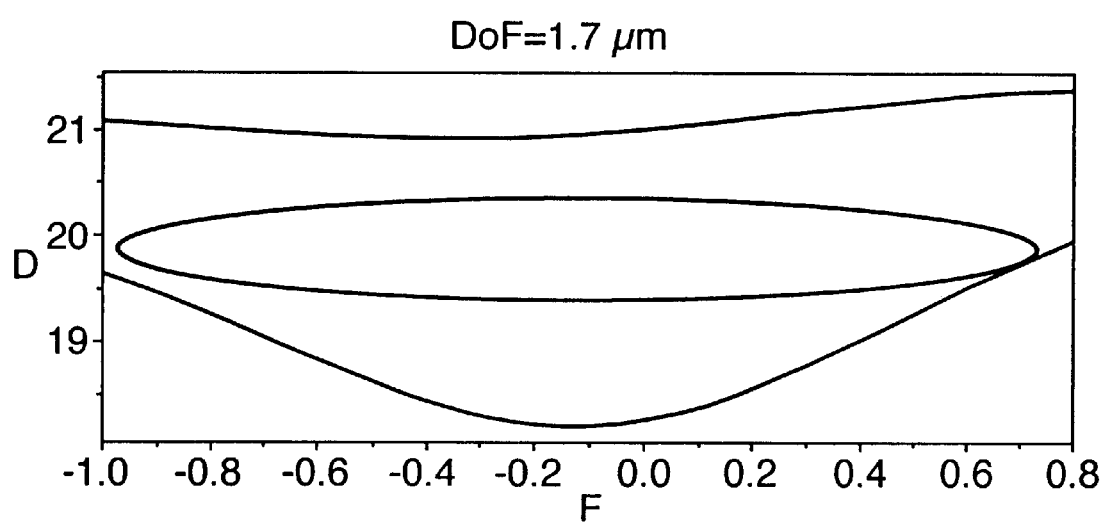
FIG. 22(D) is a graphical representation of the focus-exposure process window for maintaining a specified line-width sizing for the mask of FIG. 22(B).

FIGS. 22(A) through 22(D) show how the focus-exposure process window is enhanced using scattering bars to suppress $0^{th}$ diffraction order. FIG. 22(A) depicts the diffraction order for an uncorrected attenuated phase-shift 100 nm line with a 600 nm pitch. FIG. 22(B) depicts the diffraction orders for a corrected halftoned unattenuated chromeless layout. FIG. 22(C) is a graph showing the process window for an uncorrected attenuated phase-shift 100 nm line with a 600 nm pitch of FIG. 22(A). FIG. 22(D) is a graph showing the process window for corrected halftoned unattenuated chromeless layout of FIG. 22(B). Note that the corrected mask has four times the depth of focus of the uncorrected mask.

Figure 23A:
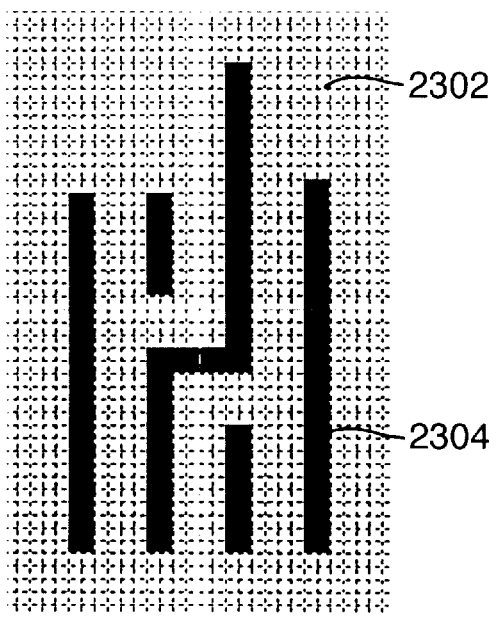
FIG. 23(A) depicts a global layout of a conventional primary feature.
Figure 23B:
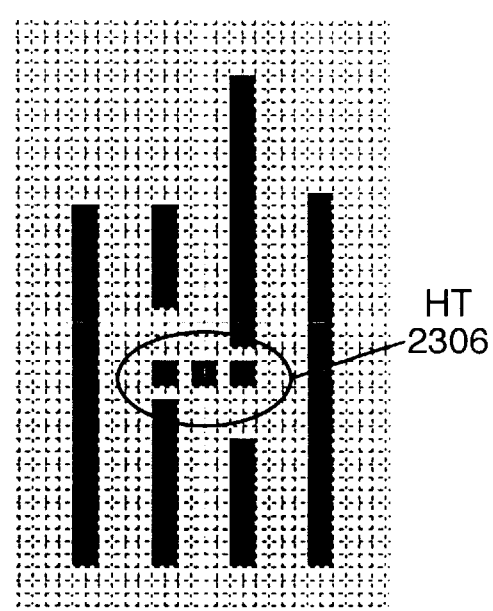
FIG. 23(B) depicts a global layout of a halftone primary feature in accordance with the present invention.
Figure 23C:
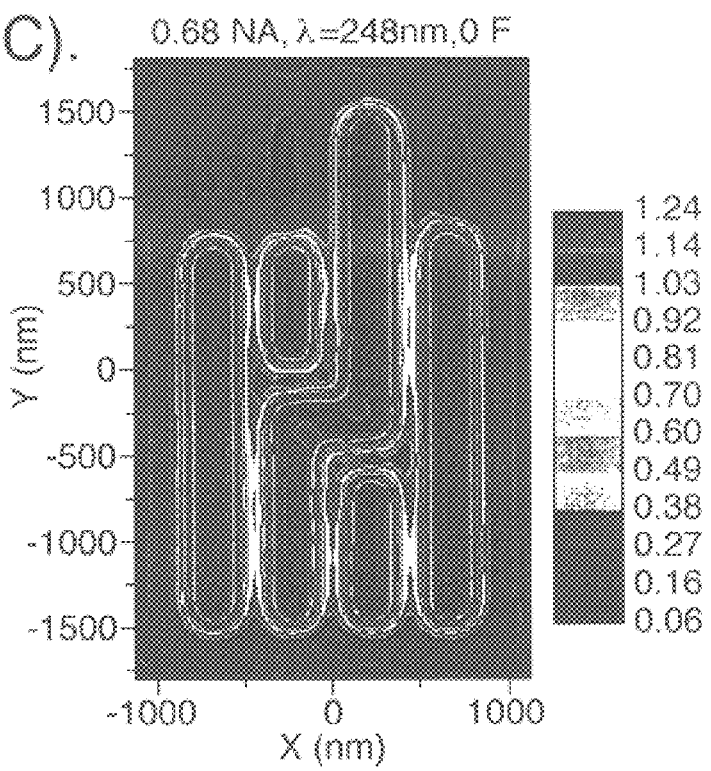
FIG. 23(C) is an aerial image of the global layout of FIG. 23(A).
Figure 23D:
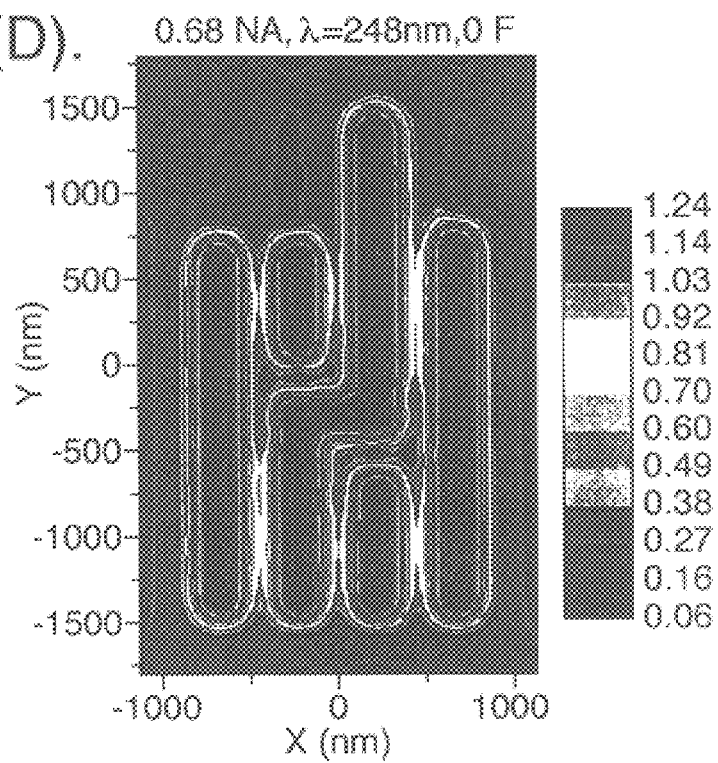
FIG. 23(D) is an aerial image of the global layout of FIG. 23(B).
Figure 23E:
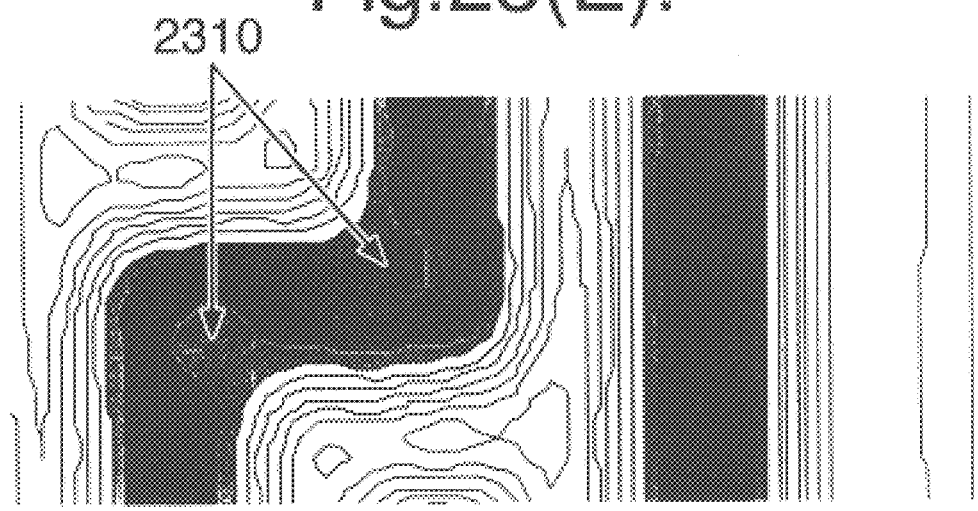
FIG. 23(E) is a magnified portion of FIG. 23(C).
Figure 23F:
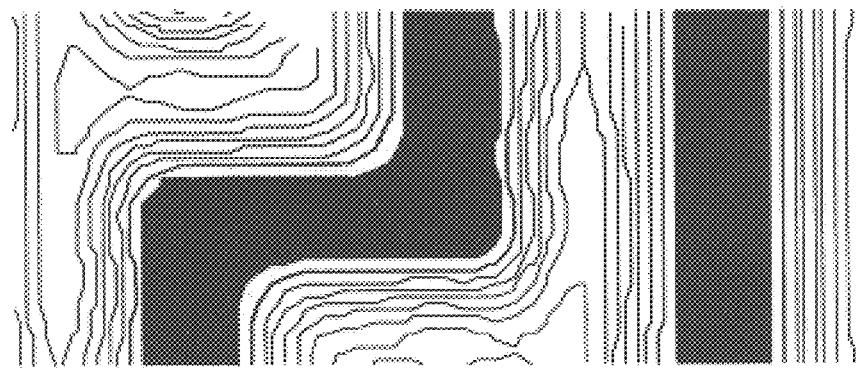
FIG. 23(F) is a magnified portion of FIG. 23(D).

FIGS. 23(A) through 23(F) show how an angle of a given pattern can be accurately compensated for using halftone structures on the primary feature. FIG. 23(A) shows a global layout of the pattern 2302 comprising primary features 2304. FIG. 23(B) shows a halftone corrected portion 2306 of an angled primary feature. FIGS. 23(C) and 23(D) are aerial images for the respective features described in 23(A) and 23(B) respectively. FIGS. 23(E) and 23(F) are magnified views of the aerial images of the angled primary feature and halftone corrected angled primary feature of FIGS. 23(C) and 23(D) respectively. As seen in FIG. 23(E), the aerial image of the primary feature includes hot spots 2310, wherein the diffraction orders are decreased as a result of destructive interference in the diffraction patterns of portions 2314, and 2312 with the diffraction pattern of portion 2316. However, as seen in FIG. 23(F), the aerial image of the primary feature does not include hot spots, thereby resulting in a more precise aerial image of the primary feature.

In addition, FIG. 23 shows that these halftone structures are used to render a plurality of sizes, shapes and pitches such that the formed images produce their respective desired size and shape with sufficient image process tolerance. These images are typically made under identical exposure conditions, but not limited to single exposure condition.

These halftoning structures can be used exterior, as assist features, or interior to the primary feature. These structures can range in transmission from 0% to 100% and they can be phase-shifted relative to the primary features or not.

Variations of the unattenuated phase-shift mask of the present invention are also possible. For example, while the hybrid disclosed in the exemplary embodiment set forth above may emulate a 26% attenuated phase-shift mask, alternatives are possible.

In the exemplary embodiment above, 600 nm pitch and 400 nm pitch have a common focus-exposure process window, however, such a relationship may be generalized. A general method for developing a focus-exposure process window that is common to multiple predetermined pitch sizes may be accomplished as described with the logic flow diagram of FIG. 24.

Figure 24:
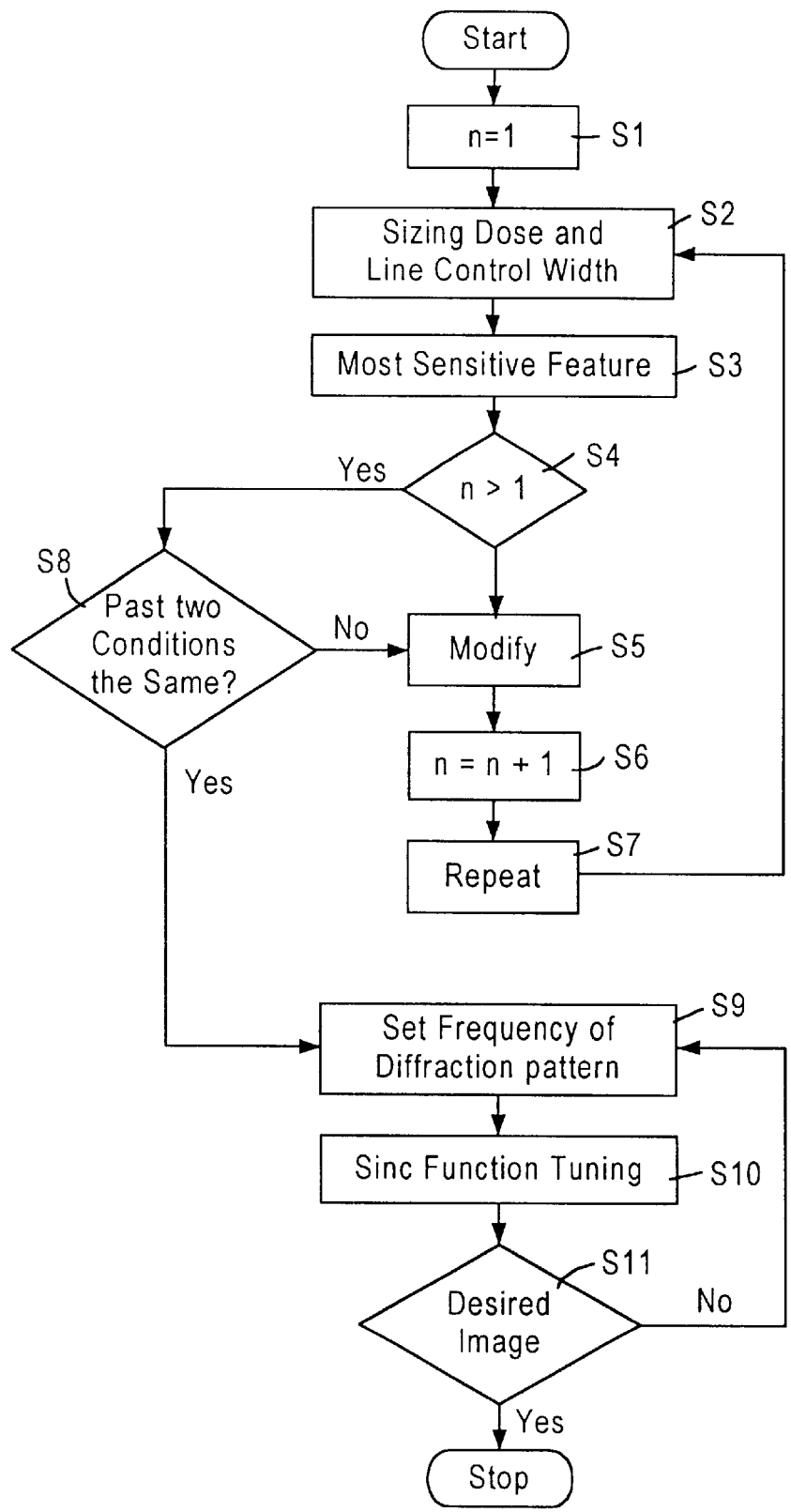
FIG. 24 is a logic flow diagram describing a method for designing patterns that emulate different phase-shift masks in accordance with the present invention.

FIG. 24 is a logic flow diagram describing a method for designing unattenuated phase-shift masks patterns, whose corresponding diffraction patterns emulate the diffraction patterns corresponding to attenuated phase-shift masks, and whose focus-exposure process window is common to predetermined pitch sizes.

After an internal counter n is set to 1 (Step S1), the sizing dose, which is the dose of exposure energy needed to make a resist image of the target size, and linewidth control for different features, including types, sizes, and pitches of interest, for different weak phase-shift mask transmissions is determined (Step S2). This determination may be found, for example, using a lithography simulator. Next, the feature with the most sensitivity to exposure, focus and aberrations is determined (Step S3). This determination additionally may be found, for example, using a lithography simulator. Next, it is determined whether the internal counter n is greater than 1, thereby indicating whether Step S2 and Step S3 have been repeated (Step S4). If n is not greater than 1 (Step S4), then a modification to the imaging process is provided that lowers the pattern's sensitivity to exposure, focus, and aberrations (Step S5). The modification may include the use of different transmission weak phase-shifting masks, exposure tool conditions, and resist processes. Again, these modifications may be provided, for example, using a lithography simulator. The internal counter is then increased by 1 (Step S6). At this point Step S2 and Step S3 are repeated to ensure that the new process conditions provided during Step S5 did not change that which was observed after the first application of Step S2 and Step S3 (Step S7).

After the second run through Step S3, the internal counter n is determined to be greater than 1, indicating that Step S2 and Step S3 have been repeated (Step S4). As such, the results of the determinations made during the first run through Step S2 and Step S3 and the second run through Step S2 and Step S3 are respectively compared (Step S8). If the comparison between the determinations found during the two previous runs through Step S2 and Step S3 are not within a predetermined threshold, i.e., new process conditions introduced at Step S5 have changed that which was observed in the first run through of the two previous runs through Step S1 and Step S2, then a new modification to the imaging process is provided (Return to Step S5). However, if the comparison between the determinations found during the two previous runs through Step S2 and Step S3 are within a predetermined threshold, i.e., new process conditions introduced at Step S5 have not changed that which was observed in the first run through of the two previous runs through Step S1 and Step S2, then the process proceeds to Step S9.

The mask layout conditions for the other features of interest, that first match the amplitude of the electric field at zero frequency of the diffraction pattern in the pupil plane of the exposure lens, and that place the maximum amplitude of the side-lobes for each isolated feature, at the frequency of the reference geometry, are then determined (Step S9). Non-limiting methods for accomplishing the mask layout conditions for the other features of interest include halftoning each feature, biasing each feature, or by adding scattering bars to isolated features. If scattering bars are used, the scattering bars should be placed at one reference pitch away from the feature being tuned, in order for the resulting diffracted image of the scattering bars plus their respective primary feature, to match the diffracted image reference feature being tuned. Further, scattering bars may be halftoned, of opposite phase and/or biased, as prescribed by the mask fabrication technology used to fabricate such patterns.

Next, the enveloping sinc [sinc(x)=sin(x)/x] function is tuned for all features so that they all have the same shape (Step S10). A sinc function is the non-discrete diffraction pattern for an isolated feature or for a series of lines and spaces. Adding scattering bars to an isolated feature modifies its sinc function by attenuating the image at certain frequencies and amplifying the image at other frequencies. The resultant diffraction pattern can resemble discrete orders even though it is the result of a sinc function. All diffraction orders of a series of lines and spaces are separated by $\lambda$/pitch, and, without the sinc envelope, are of the same magnitude. The sinc function for a single space within the series of lines and spaces varies the amplitude of each order. If scattering bars are used, the spacing may need adjusting to move the side-lobe so that the maximum amplitude is placed outside of the numerical aperture of the stepper and only the side of the side-lobe is inside the lens. This may be accomplished by reducing the primary feature's scattering bar structure pitch.

It is then determined whether all the features have the same aerial image shape attributes such as, for example, I-MAX (maximum intensity level), I-MIN (minimum intensity level), Normalized Image Log Slope, and whether the process windows of each of the features overlap (Step S11). If all the features do not have the same aerial image shape attributes, or the process windows of each of the features do not overlap, then Step S9 is repeated with a new modification to the enveloping sinc function. If all the features have the same aerial image shape attributes, and the process windows of each of the features overlap, then the process stops, wherein an optimal phase shift mask is provided.

Although certain specific embodiments of the present invention have been disclosed, it is noted that the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A method of transferring an image including $0^{th}$ diffraction order and $\pm 1^{st}$ diffraction orders, onto a material, said method comprising the steps of:

fabricating a phase shifting mask comprising at least one unattentuated, halftoned, phase-shift feature; and off-axis illuminating said mask such that light passes through said mask onto said material.

2. A method of transferring an image including $0^{th}$ diffraction order and $\pm 1^{st}$ diffraction orders, onto a material, said method comprising the steps of:

fabricating a phase shifting mask comprising at least one feature, wherein said at least one feature includes halftoned phase-shifted transparent features; and off-axis illuminating said mask such that light passes through said mask onto said material.

3. A method of claim 2, wherein said at least one feature further includes semi/transparent features.

4. A method of claim 2, wherein said at least one feature further includes opaque features.

5. A phase shifting mask comprising at least two unattentuated, halftoned, phase-shift features having a width w, said features separated by a width w, wherein said mask provides an image including $0^{th}$ diffraction order and $\pm 1^{st}$ diffraction orders, when illuminated.

6. The phase-shift mask of claim 5, wherein a focus-exposure process window for maintaining a predetermined resist line-width sizing of said mask is common to an attentuated, phase-shift feature of a similar pitch.

7. A phase shifting mask comprising at least two halftoned phase-shifted transparent features having a width w, said features separated by a width w, wherein said mask provides an image including $0^{th}$ diffraction order and $\pm 1^{st}$ diffraction orders, when illuminated.

8. The phase-shift mask of claim 7, wherein said at least two features further includes semi/transparent features.

9. The phase-shift mask of claim 7, wherein said at least two features further includes opaque features.

10. The phase-shift mask of claim 7, wherein a focus-exposure process window for maintaining a predetermined resist line-width sizing of said mask is common to an attentuated, phase-shift mask of a similar pitch.

* * * * *